(12) United States Patent
Whetsel

(10) Patent No.: US 9,435,860 B2
(45) Date of Patent: Sep. 6, 2016

(54) GATED STATE MACHINE CIRCUITRY HAVING THREE CLOCK 2 ENABLE STATES

(71) Applicant: Texas Instruments Incorporated, Dallas, TX (US)

(72) Inventor: Lee D. Whetsel, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/744,767

(22) Filed: Jun. 19, 2015

(65) Prior Publication Data

US 2015/0285861 A1  Oct. 8, 2015

Related U.S. Application Data

(62) Division of application No. 14/081,481, filed on Nov. 15, 2013, now Pat. No. 9,091,728, which is a division (Continued)

(51) Int. Cl.
*G01R 31/3177* (2006.01)
*G01R 31/317* (2006.01)
*G01R 31/3185* (2006.01)

(52) U.S. Cl.
CPC ....... *G01R 31/3177* (2013.01); *G01R 31/3172* (2013.01); *G01R 31/318536* (2013.01); *G01R 31/318572* (2013.01); *G01R 31/318577* (2013.01)

(58) Field of Classification Search
CPC .......... G01R 31/3177; G01R 31/318555; G01R 31/318544; G01R 31/318558; G01R 31/2851; G01R 31/318563; G06F 11/267

USPC .......................................... 714/724, 726, 727
See application file for complete search history.

(56) References Cited

U.S. PATENT DOCUMENTS

| 4,064,561 A | * | 12/1977 | Jennings | G06F 3/0489 341/27 |
| 4,122,519 A | * | 10/1978 | Bielawski | G05B 19/05 |
| 5,805,609 A | * | 9/1998 | Mote, Jr. | G01R 31/318558 714/30 |
| 5,887,001 A | * | 3/1999 | Russell | G01R 31/2815 714/726 |

(Continued)

OTHER PUBLICATIONS

Shen Xu Baang; Liang Song Hai, "Design and implementation of a JTAG boundary-scan interface controller," Test Symposium, 1993, Proceedings of the Second Asian, vol., No., pp. 215, 218, Nov. 16-18, 1993.*
Matos, J.S.; Pinto, F.S.; Ferreira, J.M.M., "A boundary scan test controller for hierarchical BIST," Test Conference, 1992. Proceedings., International, vol., No., pp. 217,, Sep. 20-24, 1995.*

(Continued)

*Primary Examiner* — Cynthia Britt
(74) *Attorney, Agent, or Firm* — Lawrence J. Bassuk; Frank D. Cimino

(57) ABSTRACT

Testing of integrated circuits is achieved by a test architecture utilizing a scan frame input shift register, a scan frame output shift register, a test controller, and a test interface comprising a scan input, a scan clock, a test enable, and a scan output. Scan frames input to the scan frame input shift register contain a test stimulus data section and a test command section. Scan frames output from the scan frame output shift register contain a test response data section and, optionally, a section for outputting other data. The command section of the input scan frame controls the test architecture to execute a desired test operation.

9 Claims, 20 Drawing Sheets

Related U.S. Application Data of application No. 13/870,319, filed on Apr. 25, 2013, now Pat. No. 8,618,542, which is a division of application No. 13/595,297, filed on Aug. 27, 2012, now Pat. No. 8,445,908, which is a division of application No. 13/217,851, filed on Aug. 25, 2011, now Pat. No. 8,283,665, which is a division of application No. 12/539,310, filed on Aug. 11, 2009, now Pat. No. 8,028,212, which is a division of application No. 11/670,241, filed on Feb. 1, 2007, now Pat. No. 7,657,810.

(60) Provisional application No. 60/765,300, filed on Feb. 3, 2006.

(56) References Cited

U.S. PATENT DOCUMENTS

| | | | |
|---|---|---|---|
| 6,536,008 B1* | 3/2003 | Nadeau-Dostie | G01R 31/318583 714/726 |
| 6,615,392 B1* | 9/2003 | Nadeau-Dostie | G01R 31/318586 716/103 |
| 7,409,612 B2* | 8/2008 | Van De Logt | G01R 31/318541 324/750.3 |
| 2003/0212524 A1* | 11/2003 | Cote | G01R 31/31724 702/120 |

* cited by examiner

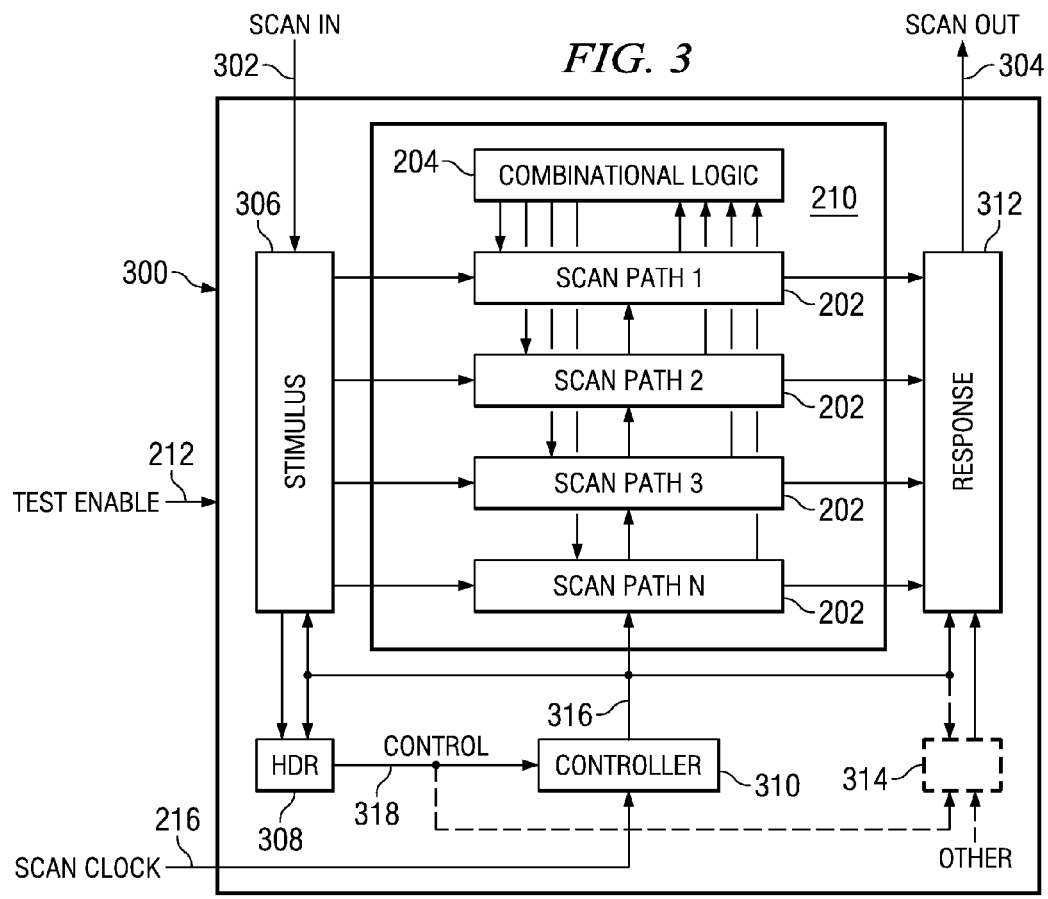
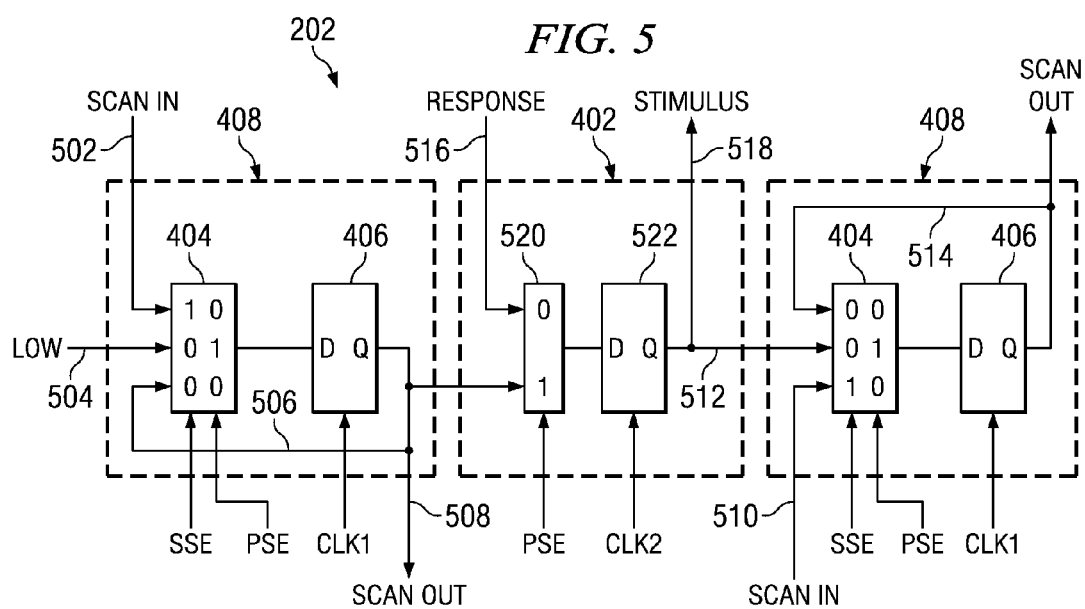

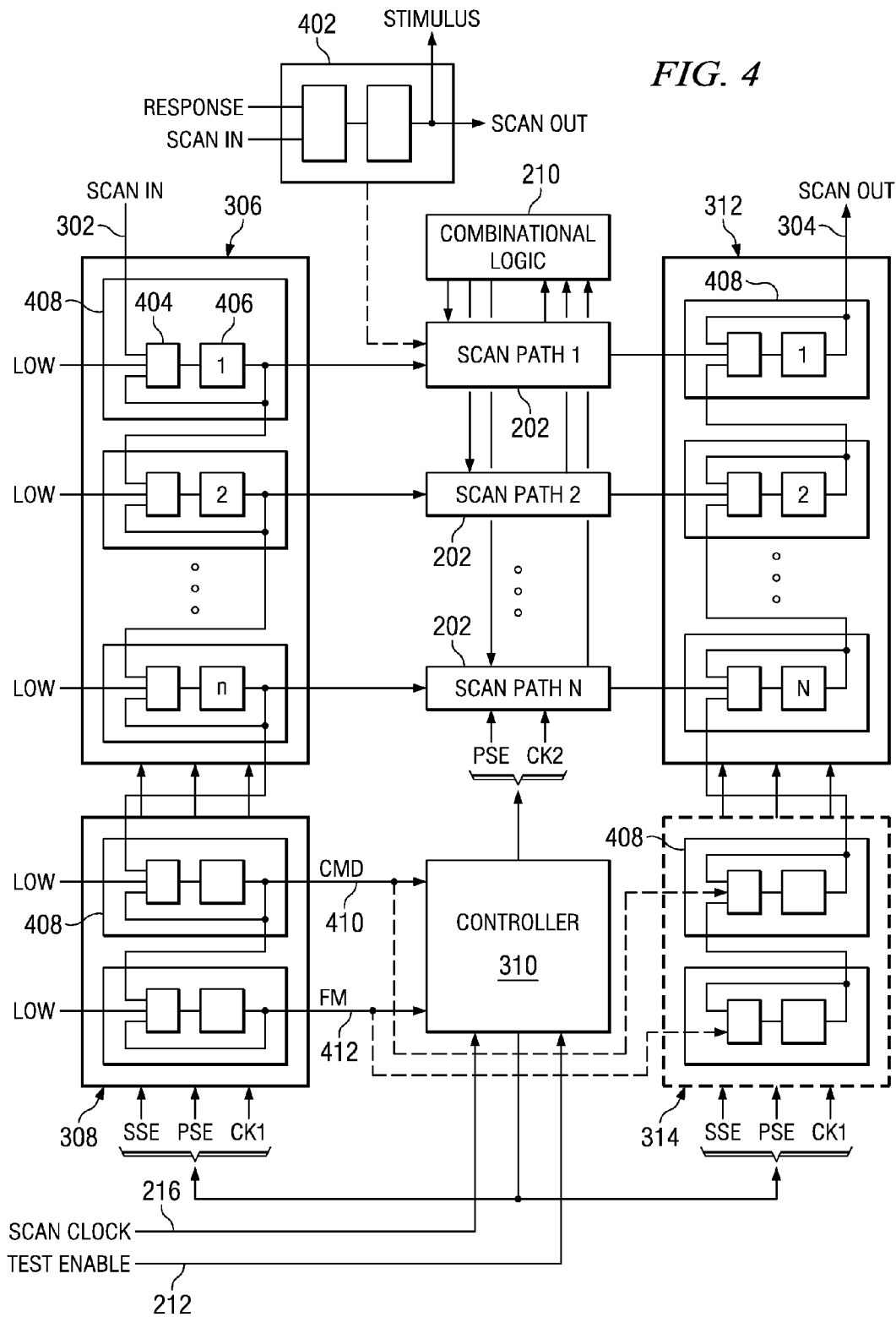

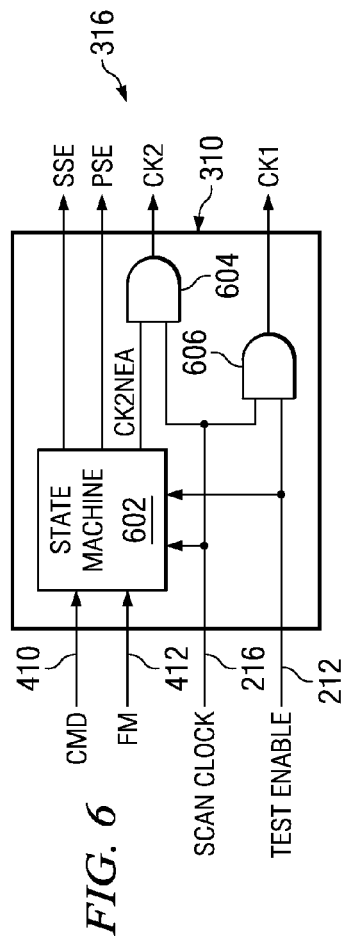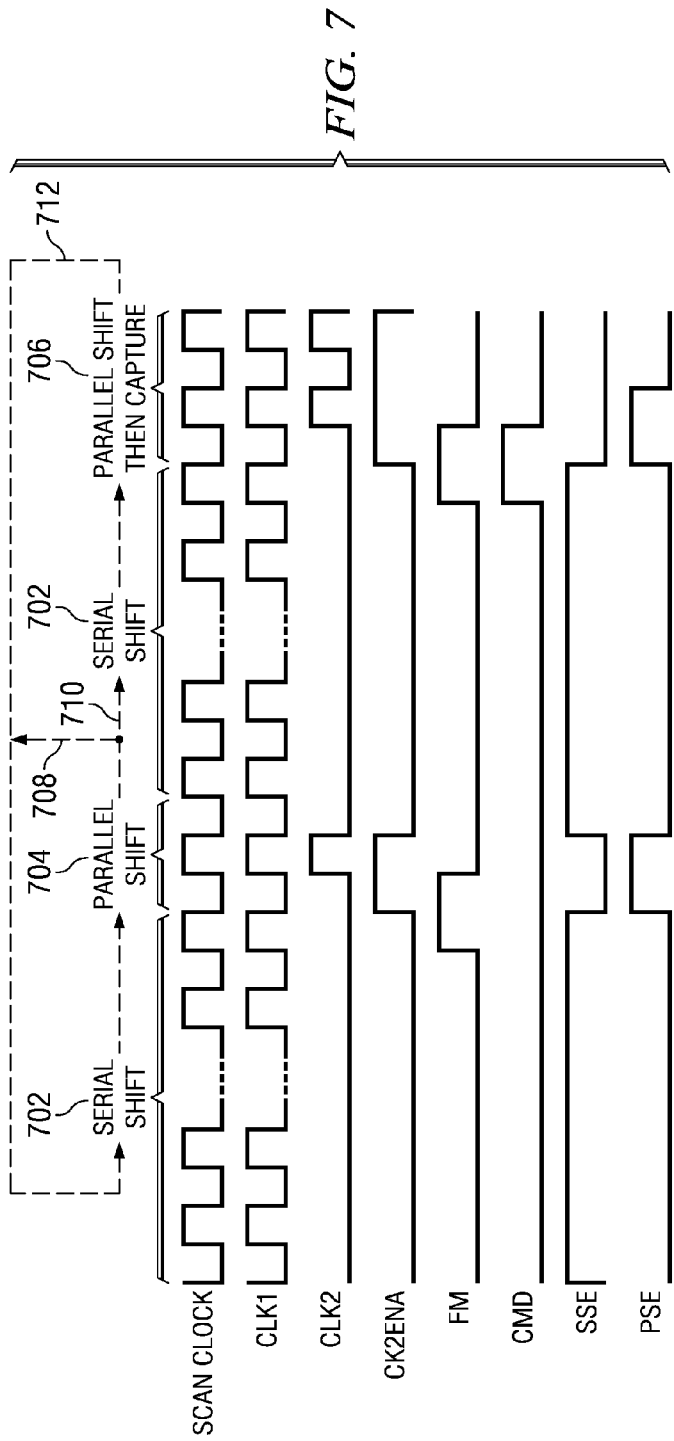

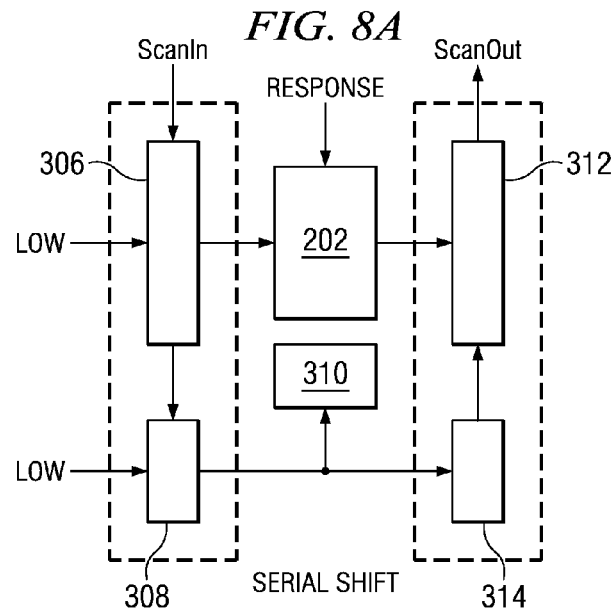
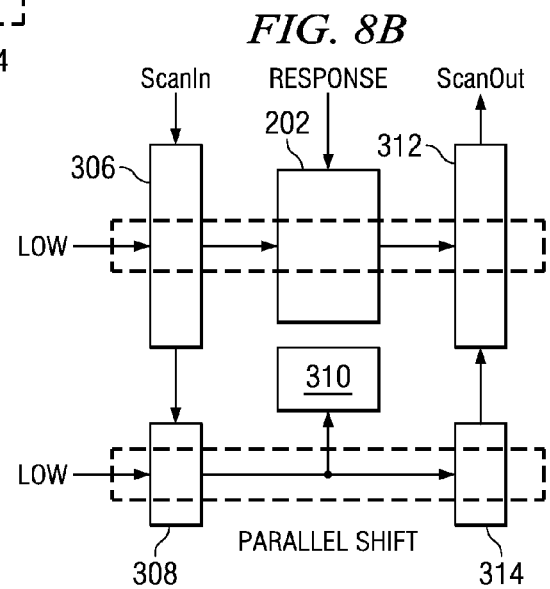
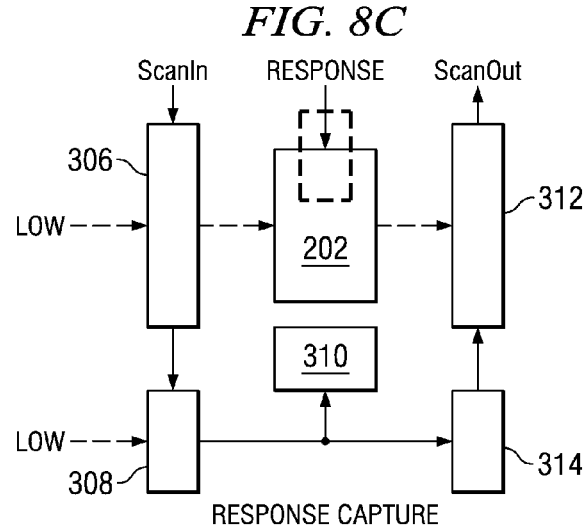

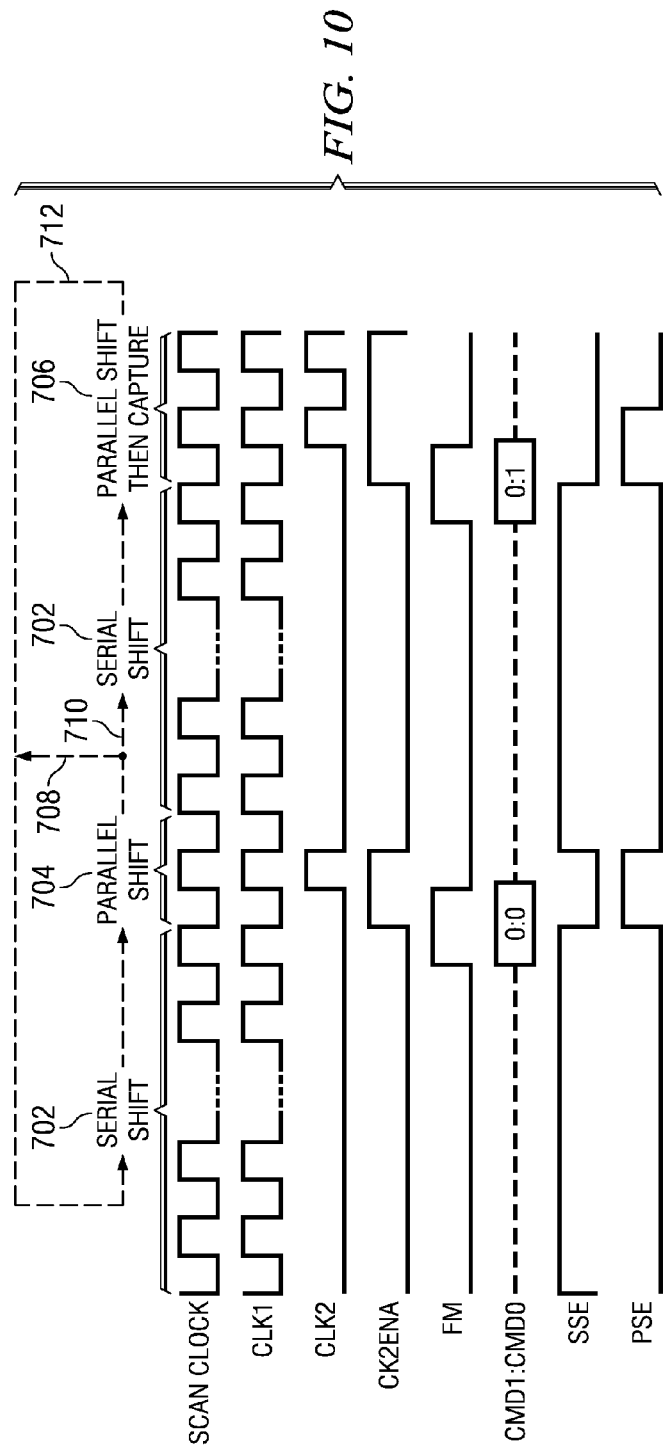

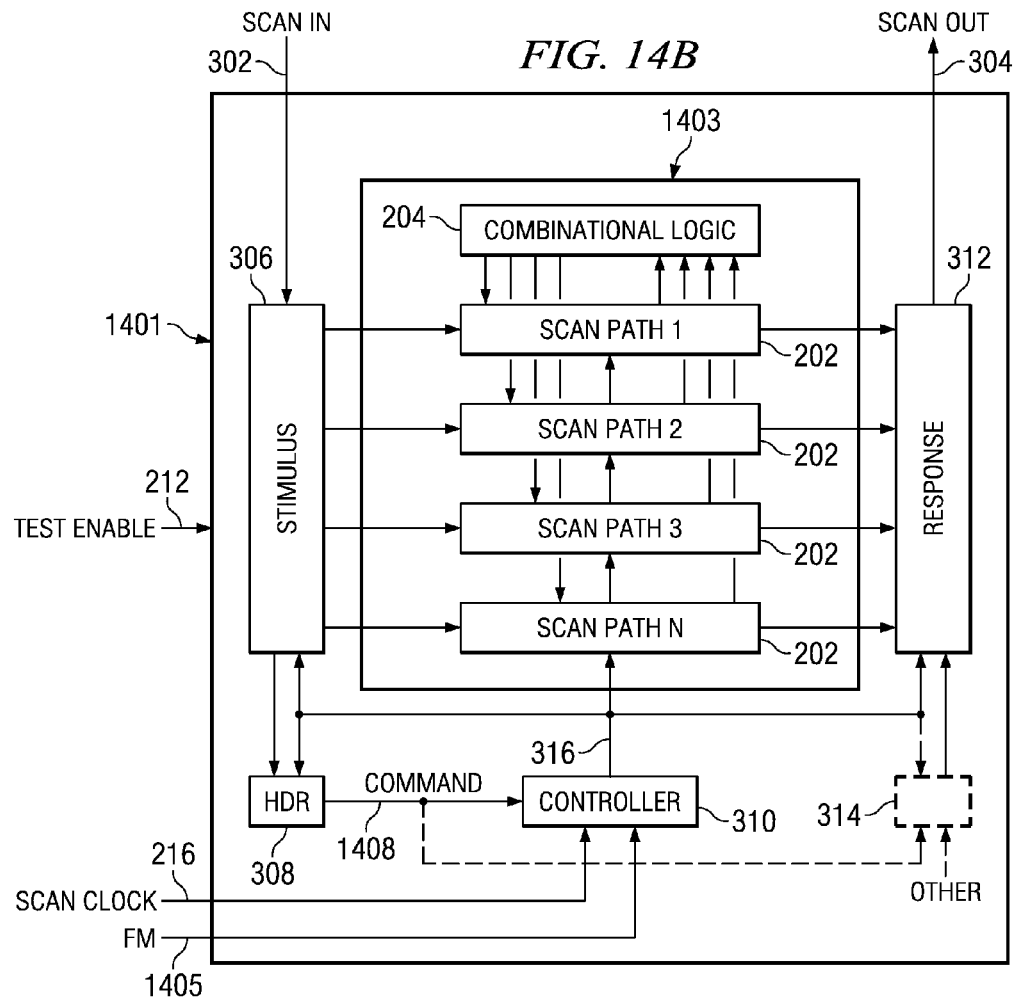
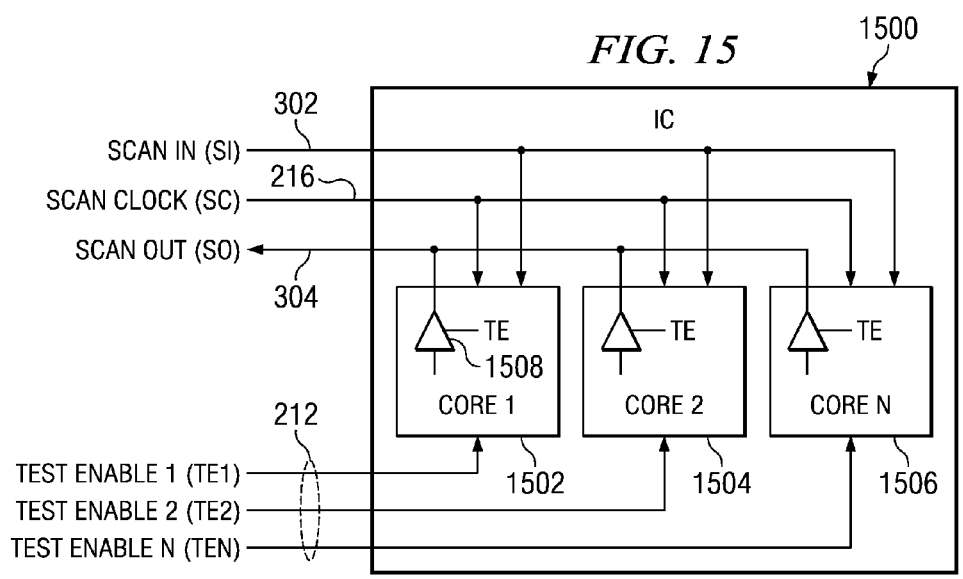

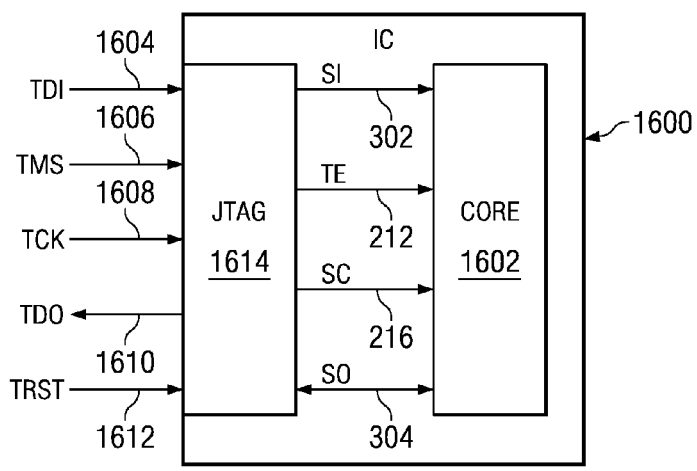
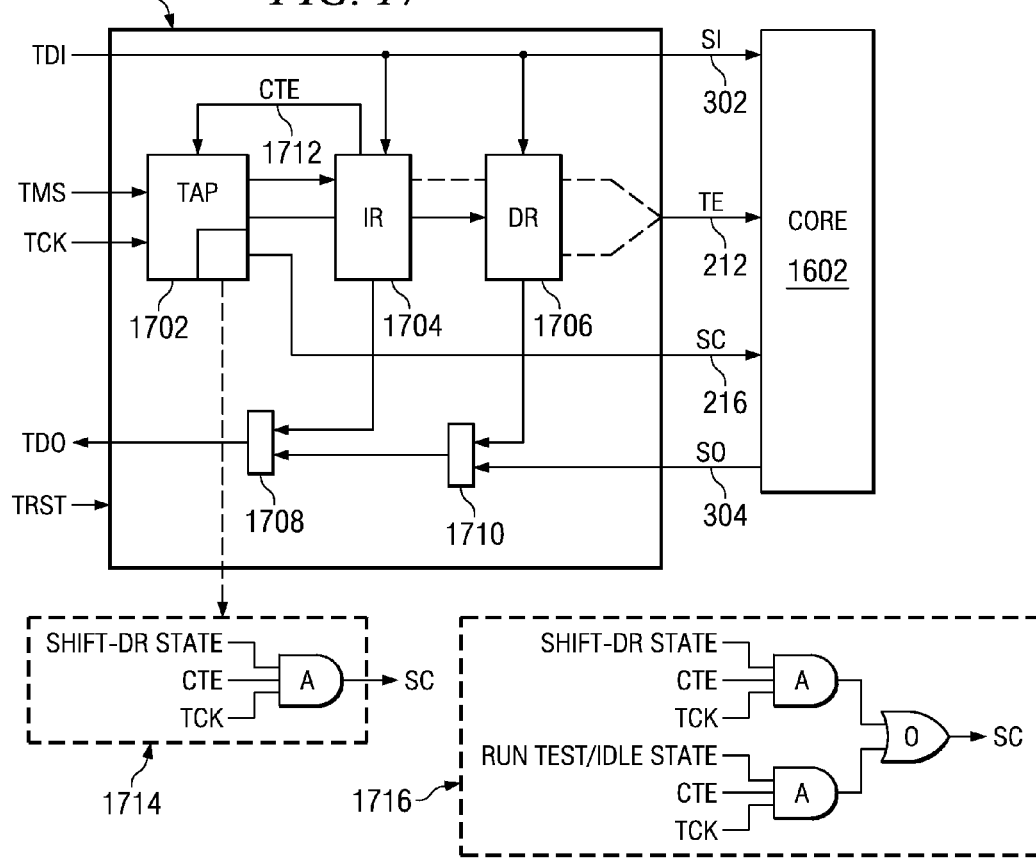

GATED STATE MACHINE CIRCUITRY HAVING THREE CLOCK 2 ENABLE STATES

CROSS REFERENCE TO RELATED APPLICATIONS

This application is a divisional of prior application Ser. No. 14/081,481, filed Nov. 15, 2013, Now U.S. Pat. No. 9,091,728, issued Jul. 28, 2015;

Which was a divisional of prior application Ser. No. 13/870,319, filed Apr. 25, 2013, now U.S. Pat. No. 8,618,542, issued Dec. 31, 2013;

Which was a divisional of prior application Ser. No. 13/595,297, filed Aug. 27, 2012, now U.S. Pat. No. 8,445,908, issued May 21, 2013;

Which was a divisional of prior application Ser. No. 13/217,851, filed Aug. 25, 2011, now U.S. Pat. No. 8,283,665, issued Oct. 9, 2012;

Which was a divisional of prior application Ser. No. 12/539,310, filed Aug. 11, 2009, now U.S. Pat. No. 8,028,212, issued Sep. 27, 2011;

Which was a divisional of prior application Ser. No. 11/670,241, filed Feb. 1, 2007, now U.S. Pat. No. 7,657,810, issued Feb. 2, 2010;

Which claimed priority from Provisional Application No. 60/765,300, filed on Feb. 3, 2006.

Pending TI patent application TI-60187, Optimized JTAG Interface, includes subject matter which is related to the subject matter of this application. TI-60187 has been assigned to the assignee of this application, and is incorporated herein by reference.

BACKGROUND OF THE DISCLOSURE

1. Field of the Disclosure

The present disclosure relates generally to scan testing of integrated circuits and, more particularly, to a method of scan testing integrated circuits whereby the scan patterns shifted into the integrated circuit contain control information that regulate how the scan patterns will be used during the testing of the integrated circuit.

2. Description of Related Art

Semiconductor manufacturers must test integrated circuits they fabricate to determine which ones are good and which ones are bad. Testing of integrated circuits is achieved by having a tester contacts the integrated circuits and apply test patterns to the integrated circuits. Today more and more integrated circuit testing is being performed by low cost testers. Low cost testers are achieved primarily in two ways; (1) decreasing the number of test contacts required between the tester and integrated circuits under test, and (2) including more efficient design for test circuitry in the integrated circuit for interfacing to the tester and executing tests. Decreasing the number of contacts between the tester and integrated circuits enables more integrated circuits to be contacted by the tester and tester in parallel. Including more efficient design for test circuitry in the integrated circuits allows the integrated circuits to be tested more quickly over the reduced contact interface to the tester.

SUMMARY OF THE DISCLOSURE

The present disclosure provides a test interface and test architecture for integrated circuits that allows scan testing of integrated circuits to occur using a reduced contact interface to low cost testers.

DESCRIPTION OF THE VIEWS OF THE DRAWINGS

FIG. 3 illustrates an integrated circuit in a parallel scan test configuration according to the present disclosure.

FIG. 4 illustrates the test architecture of the present disclosure coupled to parallel scan paths.

FIG. 5 illustrates a shift element of the input shift register and a shift element of the output shift register coupled to a scan path.

FIG. 6 illustrates an example controller of the test architecture.

FIG. 7 illustrates the test operations of the example controller of FIG. 6.

FIGS. 8A, 8B, and 8C illustrate the flow of data during each test operation of FIG. 6.

FIG. 9 illustrates a second example controller of the test architecture.

FIG. 10 illustrates test operations of the example controller of FIG. 9.

FIG. 14B illustrates an external signal being used to provide the frame marker (FM) signal of the test architecture.

FIG. 15 illustrates an integrated circuit with multiple cores each core including the test architecture of the present disclosure.

FIG. 16 illustrates a core's test architecture interfaced to a tester via a JTAG interface.

FIG. 17 illustrates a detail view of the JTAG interface of FIG. 16.

DETAILED DESCRIPTION OF THE DISCLOSURE

Figure 1:
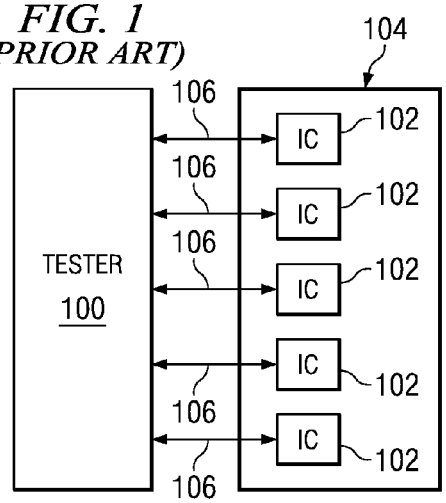
FIG. 1 illustrates a test arrangement between a tester and plurality of the integrated circuit.

FIG. 1 illustrates a conventional arrangement between a tester 100 and a group of integrated circuits 102 under tests. As seen each integrated circuit is contacted 106 by the tester to allow the tester to input and output test patterns to the integrated circuit. The integrated circuits could be integrated circuits formed on a wafer 104, integrated circuits arranged on a test fixture 104, or integrated circuits arranged within a burn in chamber 104.

Figure 2:
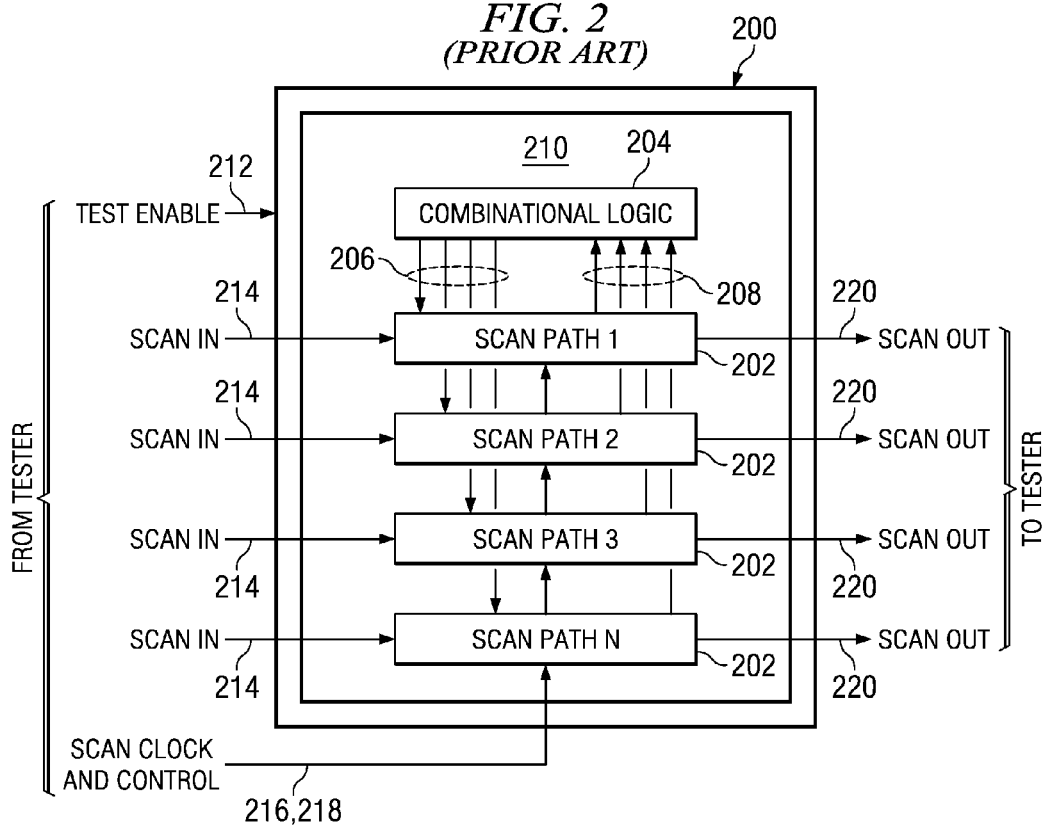
FIG. 2 illustrates an integrated circuit in a parallel scan test configuration.

FIG. 2 illustrates a conventional way a tester tests an integrated circuit 200 using parallel scan testing. As seen, the integrated circuit 200 is contacted by the tester to input a test enable input 212, scan inputs 1-N 214, a scan clock input 216, and scan control inputs 218, and to output scan outputs 1-N 220. The test enable input from the tester is used to place the integrated circuit in a test mode whereby functional flip flops are converted into scan paths 1-N 202 which are used to input stimulus test data 208 to the functional combinational logic 204 of the integrated circuit, and to received response test data 206 from the functional combinational logic 204. In this example, the scan paths and combinational logic circuits are assumed to be functional circuits associated with an embedded core 210 circuit within the integrated circuit.

When the integrated circuit is in the above described parallel scan test mode, the tester inputs stimulus test data to the scan paths 202 via the scan inputs 214 and receives response test data from the scan paths 202 via the scan outputs 220. The scan clock 216 times the operation of the scan paths 202 and the scan control inputs 218 control the scan paths 202 to either shift data in and out or to capture response data from the combinational logic. The operation of parallel scan testing is well known in the industry.

As can be seen in FIG. 2, the tester must contact the integrated circuit with a fairly large number of contacts to execute the parallel scan test. For example, if 16 scan paths are used for testing, the tester would have to have 32 contacts for the scan inputs and scan outputs, a contact for the scan clock, a number of contacts for the scan control, and a contact for the test enable. While not shown, the tester would also have contacts for power and ground to power up the integrated circuit. If a plurality of integrated circuits is to be tested in parallel, as shown in FIG. 1, the tester would need the above mentioned contacts for each integrated circuit.

FIG. 3 illustrates an integrated circuit 300 incorporating the parallel scan test architecture of the present disclosure. The integrated circuit includes a core circuit 210 which, in test mode, is arranged into parallel scan paths 202 and combinational logic 204, as described in FIG. 2. The interface of the test architecture includes a test enable 212, a scan clock 216, a scan input 302, and a scan output 304. The scan input 302 is coupled to the input of an input shift register that comprises a series connected stimulus test data section 306 and a header section 308. The scan output 304 is coupled to the output of an output shift register that comprises a series connected response test data section 312 and a header return section 314.

The header return section 314 is optional in the test architecture, as indicated by dotted line. The scan clock 216 is coupled to the input of a controller 310, which controls the operation of the scan paths 202, the input shift register, and the output shift register based on control input from the header section 308 of the input shift register. The test enable input is used to enable the controller 310 and to place the integrated circuit 300 and core 210 into a parallel scan test mode, as described in FIG. 2.

The test enable, scan clock, scan in, and scan output signals are connected to an external tester. The stimulus data section 306 has parallel outputs that are coupled to the scan inputs of the scan paths 202. The header section 308 has parallel outputs that provide control inputs 318 to the controller 310. The stimulus data section 306 and the header section 308 receive control inputs 316 from the controller 310.

The response data section 312 has parallel inputs that are coupled to the scan outputs of the scan paths 202. The optional header return section 314 has parallel inputs that can be loaded with the control 318 outputs from the header register to allow sending back the header control information to the tester to allow the tester to verify that the correct header control information was received by the controller 310. Alternately, the header return section 314 may load other data signals for sending back to the tester via the scan output 304. The response data section 312 and header return section 314 receive control inputs 316 from the controller 310.

During operation, the input shift register of the test architecture receives input scan frames of stimulus and header data from the tester via the scan input 302 and applies the received data to the parallel scan path 202 inputs and controller 310 inputs respectively. Also during operation, the output shift register sends output scan frames of response and, optionally, header or other data obtained from the scan paths 202 to the tester via the scan output 304. The controller 310 controls the operation of the input and output shift registers and the operation of the scan paths 202 based on the control 318 inputs from the header register 308. The input shift register section operates to convert the serialized input scan frame from the scan input 302 into parallel test stimulus and header data which is applied to the inputs of the scan paths 202 and controller 310 respectively. The output shift register section operates to convert the parallel test response data output from the scan paths 202 and any optional parallel data from the header return section 314 into a serialized scan frame that is output on the scan output 304.

As can be seen, the interface of the test architecture of FIG. 3 only requires four contacts from the tester, i.e. test enable, scan clock, scan input, and scan output. Thus the interface of the test architecture of FIG. 3 requires significantly less contacts from the tester that does the test architecture of FIG. 2. This reduction in tester contacts is a result of; (1) the serial to parallel conversion of the input scan frames from the scan input 302, (2) the parallel to serial conversions of the output scan frames on the scan output 304, and (3) the fact that the control 318 data to operate the test architecture is contained as a header within each input scan frame received on the scan input 302.

FIG. 4 illustrates one example implementation of the stimulus data section 306, header data section 308, response data section 312, and optional header return data section 314. The stimulus, header, response, and header return sections contain serially connected shift elements 408, each shift element including a multiplexer 404 and a flip flop 406 which are shown in more detail in FIG. 5. FIG. 5 illustrates the connection between one shift element 408 of the stimulus data section 306, a scan cell 402 of a scan path 202, and one shift element 408 of the response data section 312. While one scan cell 402 is shown in FIG. 5 it should be understood that a plurality of scan cells 402 will typically be in a scan path 202. Both FIGS. 4 and 5 should be referenced during the following description.

The multiplexer 404 of the shift elements of the stimulus 306 and header 308 sections has inputs for receiving; (1) a scan input 502, which can be from the scan input 302 of the integrated circuit or from a scan output 508 from another shift element 408, (2) a logic low signal 504, and (3) the output 506 of the shift element's flip flop 406. The multiplexer 404 of the shift elements of the response and optional header return sections has inputs for receiving; (1) a scan input 510 from a scan output of another shift element, (2) a scan output 512 from an associated scan path 202, and (3) the output 514 of the shift element's flip flop 406. The output of each multiplexer 404 is input to the data input of the shift element's flip flop 406. The multiplexers 404 allow each shift element to be controlled by the controller 310 to; (1) load data (low signal 504, scan path output 512, or data inputs to header return register 314) into flip flop 406, (2) shift data through flip flop 406 from the shift element's scan input to the scan output, or (3) hold the present state of flip flop 406.

Each scan path 202 comprise a plurality of conventional scan cells 402 which include a two input multiplexer 520 and a flip flop 522. The response input 516 to the scan cell 402 is coupled to a response output from the combinational logic 210 and the stimulus output 518 from the scan cell 403 is coupled to a stimulus input to the combinational logic 210. Multiplexer 520 allows the scan cell to load response data into flip flop 522 or to shift data through flip flop 522. Multiple scan cells 402 are connected serially via the scan cell's scan inputs and scan outputs to form a scan path 202.

The controller 310 has a command (CMD) 410 and frame marker (FM) 412 input from the header section 308, and a clock input for the scan clock 216. The CMD and FM inputs are signals on control bus 318 of FIG. 3. The controller 310 has outputs for a serial scan enable (SSE) signal, a parallel scan enable (PSE) signal, a clock 1 (CK1) signal, and a clock 2 (CK2) signal on control bus 316. The SSE, PSE, and CK1 signals from the controller are input to the input shift register's stimulus 306 and header 308 sections and to the output shift register's response 312 and header return 314 sections. The SSE, PSE, and CK1 signals control the operation of the input and output shift registers. The PSE and CK2 signals from the controller are input to the scan paths 202 via control bus 316. The PSE and CK2 signals control the operation of the scan paths 202.

At the beginning of each scan frame input to the stimulus 306 and header 308 sections, the flip flops of shift elements 408 are set low by the multiplexer selecting the low logic signal inputs 504 to be loaded into the flip flop. The first bit of the input scan frame is the frame marker (FM) bit 412 and it will be set to a logic high level. By initializing the shift elements 408 of the stimulus 306 and header 308 sections to logic lows, the controller 310 can easily detect the occurrence of the leading logic high FM bit which indicates that the stimulus 306 and header 308 sections of the input shift register have been loaded with the input scan frame. In response to detecting the logic high FM bit, the controller 310 executes a command as determined by the logical setting of the scan frame command (CMD) bit 410. This process of setting the shift elements of the input shift register low, inputting a scan frame to the input shift register with a leading logic high FM bit, detecting the occurrence of the logic high FM bit, and executing a command in response to the detecting is repeated during the test.

FIG. 6 illustrates one example implementation of controller 310. The controller includes a state machine 602 and a pair of And gates 604 and 606. The state machine inputs the CMD 410 and FM 412 signals from header section 308, and the scan clock 216 and test enable 212 signals. The test enable 212 input enables the operation of the state machine, scan clock 216 input times the operation of the state machine, the CMD 410 input provides instruction input to the state machine, and the FM input 412 indicates when a complete input scan frame has been received in the input shift register. The state machine outputs the SSE and PSE signals to control bus 316 and a CK2ENA signal. And gate 604 inputs the CK2ENA signal and the scan clock 216 signal and outputs the CK2 signal on control bus 310. And gate 606 inputs the scan clock 216 signal and the test enable signal 212 and outputs the CK1 signal on control bus 310.

FIG. 7 illustrates the operation of the controller 310 of FIG. 6 when the test enable signal 212 is set high. The operations include; a serial shift operation 702, a parallel shift operation 704, and a parallel shift then capture operation 706. During a serial shift operation 702, the SSE output is set high and the CK1 operates with the scan clock 216. The serial shift operation is used to input scan frames to the input shift register sections 306 and 308, and to output scan frames from the output shift register sections 312 and 314, as shown in dotted line in FIG. 8A. During a parallel shift operation 704, the CK1 output continues to operate with the scan clock and the PSE and CK2ENA outputs are set high for one scan clock to generate a single CK2 output signal. The parallel shift operation is used to perform a single shift operation that shifts data from the stimulus section 306 of the input shift register to the scan paths 202 and data from the scan paths 202 to the response section 312 of the output shift register as shown in dotted line in FIG. 8B. The parallel shift operation also shifts logic lows into the shift elements 408 of the input shift register. If the header return section 314 of the output shift register is used, the single shift of the parallel shift operation also shifts data from the header section 308 of the input shift register to the header return 314 section of the output shift register, also as shown in dotted line in FIG. 8B. During a parallel shift then capture operation 706, the CK1 output continues to operate with the scan clock, the PSE and CK2ENA outputs are set high for one scan clock which produces a first CK2 output that performs the parallel shift operation shown in FIG. 8B, then the PSE is set low while the CK2ENA remains high for an additional scan clock which produces a second CK2 output that performs a response capture operation that loads response data from combinational logic into the scan paths 202 as shown in dotted line in FIG. 8C.

As seen in the timing diagram of FIG. 7, the state machine operates between the serial shift operation 702 and the parallel shift operation 704, using an inner loop 708, until the scan paths 202 require only one more parallel shift to be filled with stimulus and emptied of response. When this condition occurs the state machine enters an output loop 712, by way of transition 710, which includes performing a last serial shift operation 702 followed by performing a parallel shift then capture operation 706. After completing the parallel shift then capture operation 706, the state machine returns to the serial shift operation 702 and repeats the above described operation sequences.

In the timing diagram it is seen that when a FM signal 412 occurs, the state machine interprets the logic level of the CMD signal 410 to determine the operation to be performed. In this example, a logic low on CMD signal 410 causes the state machine to operate in the inner loop 708, and a logic high on CMD signal 410 causes the state machine to operate in the outer loop 706.

Figure 11:
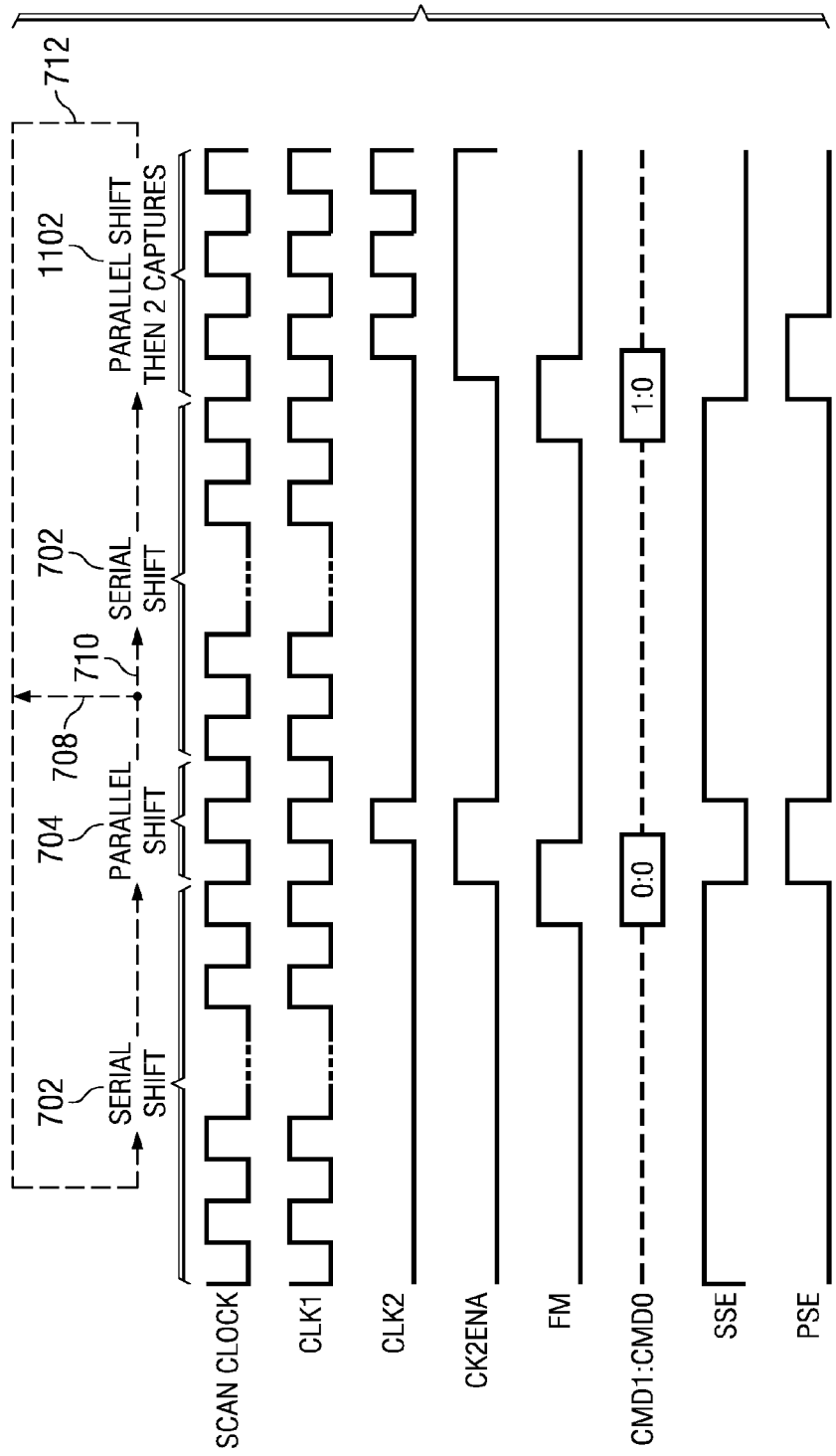
FIG. 11 illustrates additional test operations of the example controller of FIG. 9.

FIGS. 9, 10 and 11 are shown in illustrate that a plurality of CMD bits may be used within an input scan frame to enable the controller's state machine to be commanded to perform a wider variety of test operations. To increase the number of CMD bits, the header section 318 of the input shift register simply needs to be augmented with an additional shift element 408 for each additional CMD bit added to the input scan frame.

FIG. 9 illustrates an example controller 310 which is similar to the controller 310 shown in FIG. 6 with the exception that the controller's state machine 902 is designed to receive two CMD bits inputs (CMD0 and CMD1) from the header section 308 of the input shift register. The CMD0 and CMD1 bits enable the controller's state machine to perform the test operations previously described in regard FIGS. 6 and 7 (i.e. the serial shift operation 702, the parallel shift operation 704, and the parallel shift then capture operation 706) and additional test operations.

FIG. 10 illustrates the timing diagram of the state machine 902 operating in the previously described inner loop 708 in response to CMD1:CMD0 bits being 0:0 when the FM goes high, and entering the outer loop 712, by way of transition 710, in response to the CMD1:CMD0 bits being 0:1 when the FM goes high. The test operations performed in FIG. 10 are the same as in FIG. 7. The only difference is that the state machine 902 of controller 310 performs the test operations in response to two command bit inputs instead of one command bit input.

FIG. 11 illustrates the timing diagram of the state machine 902 operating in the previously described inner loop 708 in response to CMD1:CMD0 bits being 0:0 when the FM goes high, and entering the outer loop 712, by way of transition 710, in response to the CMD1:CMD0 bits being 1:0 when the FM goes high. As seen, the outer loop 712 of FIG. 11 includes a new operation 1102 referred to as parallel shift then 2 captures as a result of the CMD1:CMD0 bits being 1:0. The new operation does two back to back response capture operations instead on the single response capture operation of operation 706 of FIGS. 7 and 10. Performing back to back capture operations is commonly used in the industry as a way of testing timing sensitive paths between stimulus patterns input to combinational logic and resulting response patterns output from combinational logic.

The state machine may similarly use the remaining decode of the CMD1:CMD0 bits from the header section 308, in this example 1:1, to provide any other desired test operation. While the controller 310 examples of FIGS. 9-11 can decode two command bits into four different test operations, additional test operations can be defined and decoded by simply increasing the number of command bit inputs to the state machine 902 of controller 310. Further while the examples of FIG. 9-11 used particular decodes of the command bit inputs to achieve the test operation, any decode of the command bits may be used to achieve the test operations.

Figure 12:
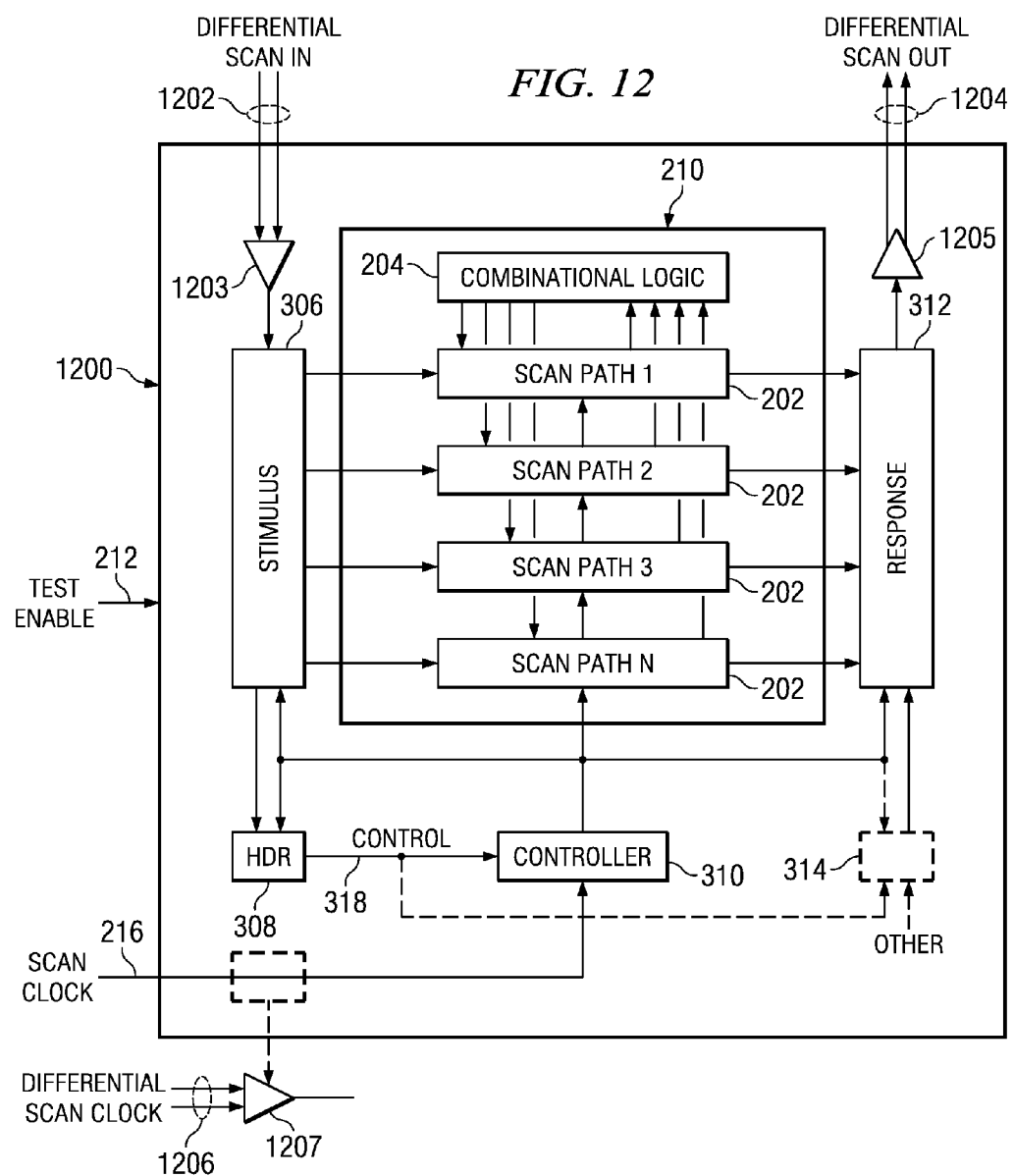
FIG. 12 illustrates the test architecture of the present disclosure using differential input and output signals for interfacing to the tester.

FIG. 12 illustrates an integrated circuit 1200 including the test architecture of the present disclosure. The test architecture is the same as the test architecture previously shown and described in regard to FIG. 3 with the exceptions that; (1) the internal scan input to the input shift register sections 306 and 308 is externally provided by differential scan input signals 1202 that drive a differential input buffer 1203, and (2) the internal scan output from the output shift register sections 312 and 314 is provided externally by differential scan output signals 1204 that are driven by a differential output buffer 1205. Use of differential scan input 1202 and scan output 1204 signals provide improved noise immunity to the scan input frame data to the test architecture from the tester and the scan output frame data from the test architecture to the tester. Also using differential scan input 1202 and scan output 1204 signaling between the test architecture and tester allows the tester to increase the data rate (bandwidth) of the scan frame input to the test architecture and the scan frame output from the test architecture, which decreases the amount of time it takes to perform the parallel test operation on core 210.

To improve noise immunity and operational frequency of the scan clock 216, the scan clock 216 can be replaced, as the scan input 302 and scan output 304 were replaced by differential scan inputs and scan outputs, by differential scan clock inputs 1206 that drive the internal scan clock of the test architecture via a differential input buffer 1207. Use of the shown differential scan inputs, scan outputs, and scan clock inputs allows the tester to send and receive scan frames to and from the test architecture at much higher data rates than would be possible using the single ended scan input, scan output, and scan clock signaling of FIG. 3. Any type of differential signaling may be used in the example of FIG. 12, however low voltage differential signaling (LVDS) would probably be the most commonly used type of differential signaling due to its high speed operation and low power consumption attributes.

Figure 13:
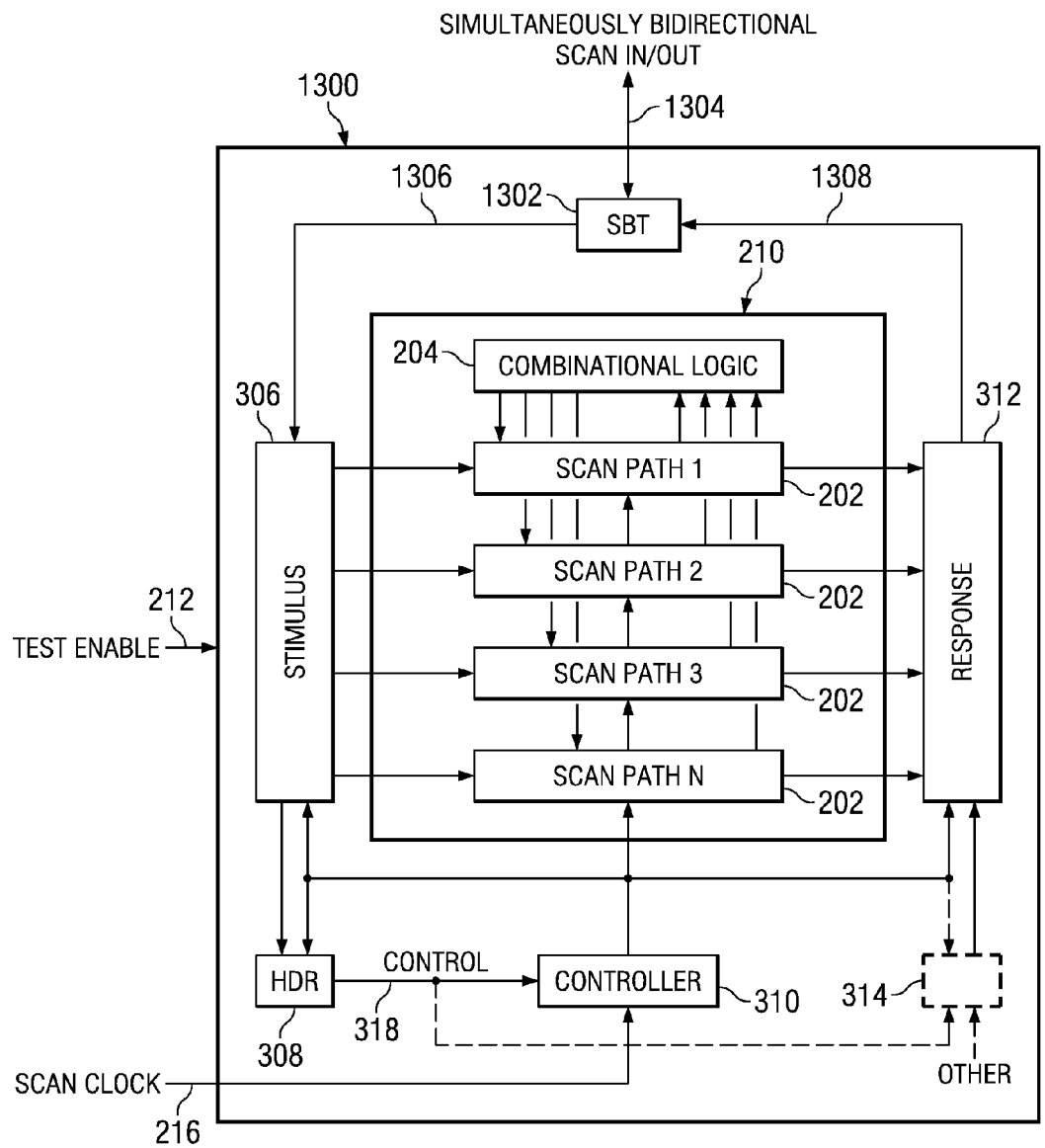
FIG. 13 illustrates the test architecture of the present disclosure using a simultaneously bidirectional transceiver (SBT) for interfacing to the tester.

FIG. 13 illustrates an integrated circuit 1300 including the test architecture of the present disclosure. The test architecture is the same as the test architecture previously shown and described in regard to FIG. 3 with the exception that the scan input 1306 to the input shift register sections 306 and 308 and the scan output 1308 from the output shift register sections 312 and 314 is provided by a single external simultaneously bidirectional scan input/output signal 1304, via a simultaneously bidirectional transceiver (SBT) circuit 1302. The SBT 1304 is a known interface circuit that has a unidirectional input, in this example scan output 1308, a unidirectional output, in this example scan input 1306, and a bidirectional input/output channel, in this example simultaneously bidirectional scan input/output 1304. The SBT's unique feature of being able to use a single channel to simultaneously transfer the unidirectional input 1308 and unidirectional output 1306 signals on the bidirectional input/output signal channel 1304 is best described using FIG. 13A.

Figure 13A:
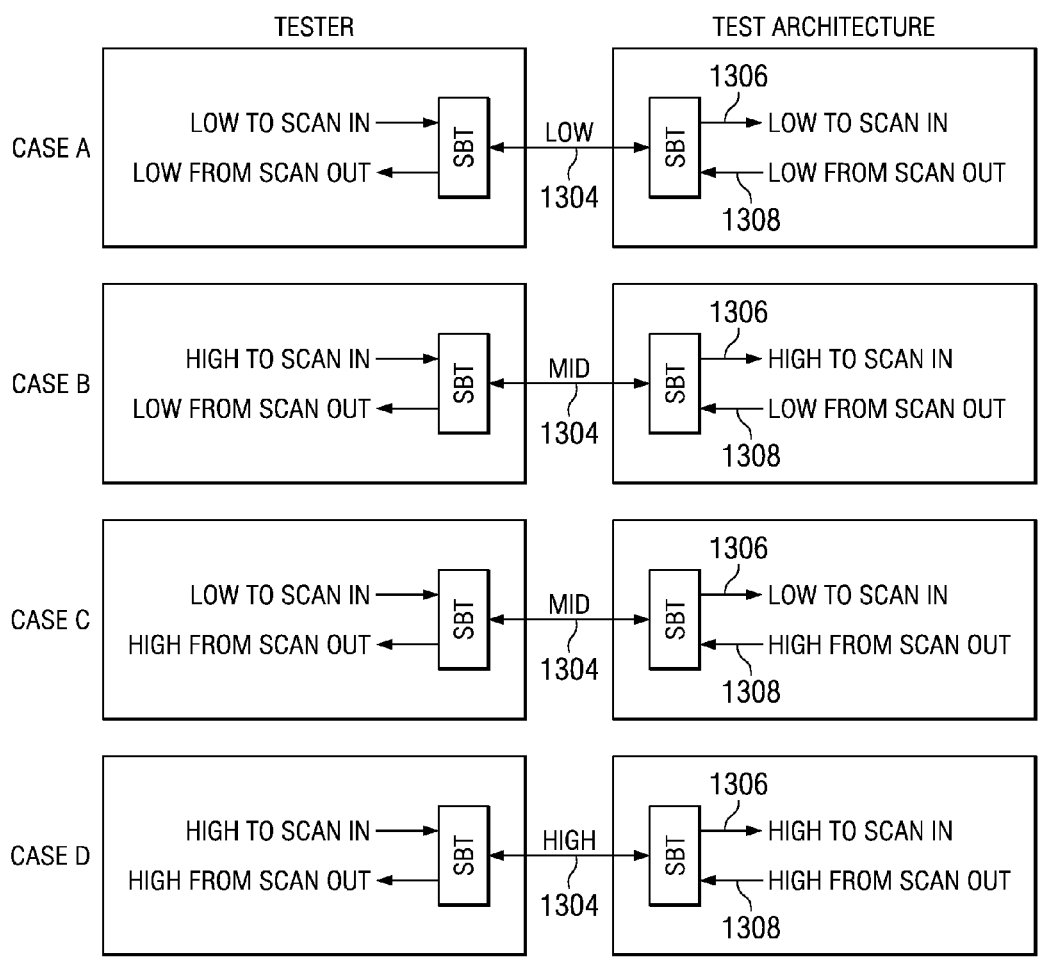
FIG. 13A illustrates the operation of the simultaneously bidirectional transceiver circuit interface between a tester and the test architecture.

In FIG. 13A, the four cases of SBT signal transfer (A, B, C, D) are shown between a tester and the test architecture within an integrated circuit. Case A shows the tester outputting a logic low to signal 1304 via an SBT and the test architecture outputting a logic low to the signal 1304 via an SBT. In response to the low outputs from the tester and test architecture, signal 1304 is low which causes the tester and test architecture to input logic lows. Case B shows the tester outputting a logic high to signal 1304 via an SBT and the test architecture outputting a logic low to the signal 1304 via an SBT. In response to the high output from the tester and the low output from the test architecture, signal 1304 is driven to a mid-voltage level between high and low. In response to the mid-voltage level on signal 1304, the tester inputs the logic low from the test architecture and the test architecture inputs the logic high from the tester.

Case C shows the tester outputting a logic low to signal 1304 via an SBT and the test architecture outputting a logic high to the signal 1304 via an SBT. In response to the low output from the tester and the high output from the test architecture, signal 1304 is driven to a mid-voltage level between high and low. In response to the mid-voltage level on signal 1304, the tester inputs the logic high from the test architecture and the test architecture inputs the logic low from the tester. Case D shows the tester outputting a logic high to signal 1304 via an SBT and the test architecture outputting a logic high to the signal 1304 via an SBT. In response to the high outputs from the tester and test architecture, signal 1304 is high which causes the tester and test architecture to input logic high. More detail descriptions of the operation of SBT circuits are well documented in the industry.

Use of the SBT circuitry enables the tester to access the test architecture for scan frame input and output operations using only a single external signal connection 1304, which further reduces the number of contact signal between the tester and test architecture within the integrated circuit. In addition to reducing the number of contacts, the SBT scan frame input and output signaling rate over signal path 1304 can be equal to or even greater than the scan frame signaling rate using the unidirectional scan input 302 and scan output 304 signals of FIG. 3.

In the description of the disclosure thus far, the FM 412 signal from header section 308 has been described as the signal that causes the controller 310 to execute a command based on the logic levels of the CMD 410, 904, 906 signals. It should be understood the FM signal may come from another source other than the header section 308. For example, the FM signal may come from the tester via an additional external input to the test architecture. Alternately, the FM signal could come from another type of circuit within the integrated circuit, such as the counter circuit described in FIG. 14A.

Figure 14A:
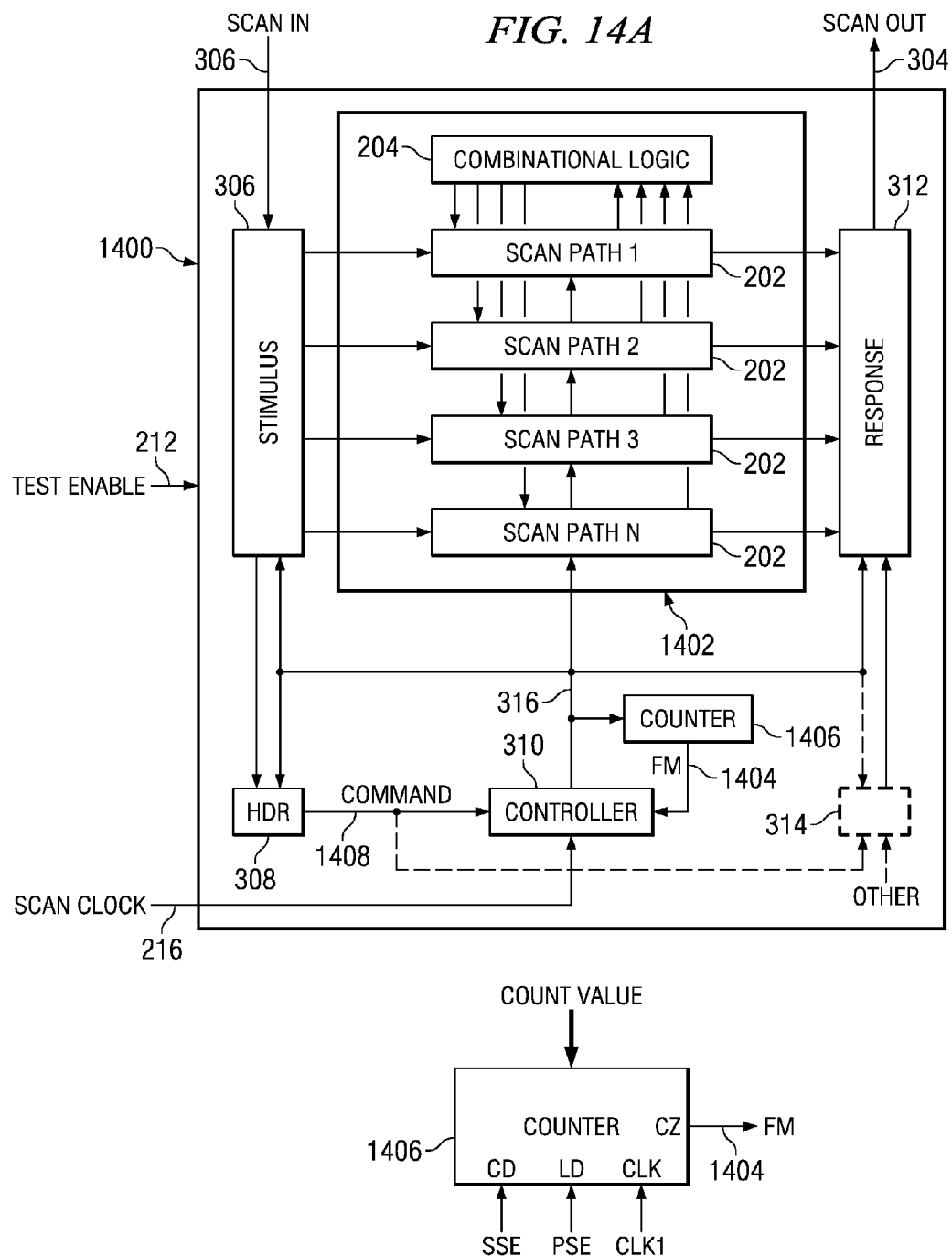
FIG. 14A illustrates a counter circuit being used to provide the frame marker (FM) signal of the test architecture.

FIG. 14A illustrates a counter circuit 1406 within the integrated circuit being used to produce a frame marker (FM) signal 1404 to controller 310 to cause the controller to execute a command based on the CMD inputs 1408 from the header section 308. The structure and operation of the test architecture is the same as previously described with the exception that; (1) a counter 1406 has been added to generate the FM signal 1404, (2) the header section 308 does not include a shift element 408 for the FM signal, and (3) the control input of the controller 310 that received the FM signal 412 of FIGS. 3, 4, and 6 now receives the FM signal 1404 from the counter 1406. The operation of the test architecture of FIG. 14 can be represented by the timing diagram of FIG. 6 by simply replacing the FM signal 412 of FIG. 6 with the FM signal 1404 of FIG. 14. At the beginning of the test, the counter is loaded with a count value representing the bit length of the stimulus 306 and header 308 sections of the input shift register, which is the input scan frame bit length.

Following the counter load operation, a serial shift operation 702 starts to input the input scan frame and output the output scan frame. With the SSE high and scan clocks 216 applied, the counter counts down (CD) each time a scan frame bit is shifted into the input shift register. When the counter goes to a count of zero (CZ), the counter outputs the FM signal 1404 that indicates that a complete input scan frame has been shifted into the stimulus and header sections of the input shift register. In response to the FM signal, the controller 310 executes a command based on the logical settings of the CMD bits 1408 from the header section 308.

The command can be to execute the previously described parallel shift operation 704, the previously described parallel shift then capture operation 706, the previously described parallel shift then 2 captures operation 1102, or any other defined test operation. Following the execution of the test operation, the controller performs a serial shift operation 702 to input the next input scan frame and output the next output scan frame.

In response to the FM 1404 input, the controller sets the PSE signal high for one scan clock 216 which causes the counter to reload (LD) the count value for the next scan frame input and output operation that occurs during the serial shift operation 702. While a count down counter was used in this example, a count up counter or any other type of circuit that can count or otherwise determined when the correct number of scan frame bits have been shifted into the input shift register may be used as well.

FIG. 14B is provided to illustrate an integrated 1401 in which the FM signal to the controller 310 is externally input from the tester via an external FM input signal 1405. The structure and operation of the test architecture of FIG. 14B is identical to that of FIG. 14A with the exception that the counter of FIG. 14A has been deleted and an additional external input to the test architecture is provided to allow the tester to input the FM signal 1405 to cause the controller 310 to execute the command 1408 from header section 308. The alternate FM input techniques shown in FIGS. 14A and 14B may be used in place of inputting the FM from header section 308 of FIG. 4 in any of the test architectures described herein.

FIG. 15 illustrates an integrated circuit 1500 that includes a plurality of cores 1502-1506 each including the test architecture of the present disclosure. Each core test architecture is interfaced to the tester via the scan input 302, scan output 304, and scan clock 216 signals. Each core test architecture is interfaced to the tester via a unique test enable 212 signal (1-N) to allow the tester to enable one of the cores for testing while the other cores are not tested. As seen, each core test architecture has a tristate output buffer 1508 to allow the output shift register of the enabled core test architecture to output response data to the tester via the scan output signal 304. The testing of the integrated circuit's cores occurs one at a time by the tester enabling and testing a first core, then enabling and testing a second core, and so on.

While the scan input 302, scan output 304, scan clock 216 and test enable 212 signals of the test architecture have been described as being externally accessible by a tester, there may be times when these signals are internal signals that are accessed by another set of test interface signals. FIG. 16-19 illustrates examples of accessing the scan input, scan output, scan clock, and test enable signals of the test architecture via the standard IEEE 1149.1 (JTAG) test access port (TAP), which is a very common and widely used integrated circuit test interface.

FIG. 16 illustrates an example of an integrated circuit 1600 having a JTAG circuit 1614 interfaced to a core 1602 that includes the scan input (SI) 302, test enable (TE) 212, scan clock (SC) 216, and scan output (SO) 304 interface of the test architecture of the present disclosure. The JTAG circuit has external signal leads for a test data input (TDI) 1604, test mode select (TMS) 1606, test clock (TCK) 1608, test data output (TDO) 1610, and test reset (TRST) 1612. During test, these external signal leads are coupled to a tester. Internally, the JTAG circuit is coupled to the SI, TE, SC, and SO signal of the test architecture. Testing of the core is achieved by the tester operating the external JTAG signal leads to access the core's test architecture via the internal SI, TE, SC, and SO test interface signals.

FIG. 17 illustrates the JTAG circuit 1614 in more detail. The structure and operation of the JTAG circuit is well known in the industry. The JTAG circuitry includes a TAP 1702 controller which enables serial access to either the instruction register (IR) 1704 or a selected data register (DR) 1706. When the IR 1704 is accessed, serial data is scanned into the IR via the TDI input and serial data is scan out of the IR via the TDO output. When a DR 1706 is accessed, serial data is scanned into the DR via the TDI input and serial data is scan out of the DR via the TDO output. Multiplexers 1708 and 1710 are controlled by the JTAG circuitry to allow the IR or selected DR output to drive the TDO during access.

As seen, the SI input of the test architecture is coupled to the TDI input, the TE input of the test architecture is coupled to an output from either the IR or DR, and the SC of the test architecture is selectively coupled, by a new circuit 1714 added to the TAP controller, to the TCK input. To prepare for testing the core, the IR is scanned to load a core test instruction that sets a core test enable (CTE) signal 1712 high and selects the SO of the test architecture to be input to multiplexer 1708 via multiplexer 1710. If the TE signal comes from the IR, it is also set high by the core test instruction to enable the core for testing. If the TE signal comes from a DR, the DR will be scanned to set TE high prior to loading the core test instruction into the IR. The CTE signal is input to the new circuit 1714 of the TAP controller, which in this example is a three input And (A) gate.

After the core test instruction has been loaded, the TAP controller goes to the Shift-DR state, which is the state that enables data to be serially input to the selected DR on TDI and output from the selected DR on TDO. In this case, the data input on TDI, which is the input scan frame, will be input to the test architecture's input shift register sections 306 and 308 and the data output on TDO, which is the output scan frame, will be output from the test architectures output shift register sections 312 and 314. While the TAP controller is in the Shift-DR state, a logic high signal will be input to the Shift-DR State input of the And gate 1714. With the Shift-DR State input high and the CTE input high, the And gate 1714 is gated on to allow the TCK input to drive the SC input of the test architecture.

With the JTAG circuit 1614 setup as described above, the SC input of the test architecture is driven by TCK, input scan frames are input to the test architecture's input shift register via the connection between TDI and SI, and output scan frames are output from the test architecture's output shift register via the connection formed between SO and TDO. The TAP controller remains in the Shift-DR state until all input and output scan frames required to test the core have been streamed into and out of the core's test architecture. After the test has been completed, the TAP controller transitions from the Shift-DR state, which sets the Shift-DR State input to And gate 1714 low, gating off the test architecture's SC signal from the JTAG TCK signal.

The above described test architecture scan framing input and output operation occurs continuously while the TAP controller 1702 is in the Shift-DR state, which reduces the time to test the core. If desired, the JTAG circuit 1614 may be designed to perform scan frame input and output operations in a non-continuous mode by cycling the TAP controller through its DR shifting states (i.e. Select-DR, Capture-DR, Shift-DR, Exit1-DR, and Update-DR states) to load an input scan frame and unload an output scan frame then transitioning the TAP controller to the RunTest/Idle state to execute the command in the input scan frame. During the RunTest/Idle state, the JTAG circuit will be designed to allow the TCK to drive the SC input of the test architecture to execute the command. Circuit 1716 comprising And (A) and Or (O) gates can be substituted for circuit 1714 to enable this alternate method by allowing TCK to drive the SC to input and output a scan frame during the Shift-DR state, then allowing the TCK to drive the SC to execute the command during the RunTest/Idle state. However this alternate method of inputting and outputting a scan frames is less efficient than just remaining in the Shift-DR state and continuously inputting and outputting the scan frames since time must be taken to cycle the TAP controller through its DR shifting and RunTest/Idle states.

Figure 18:
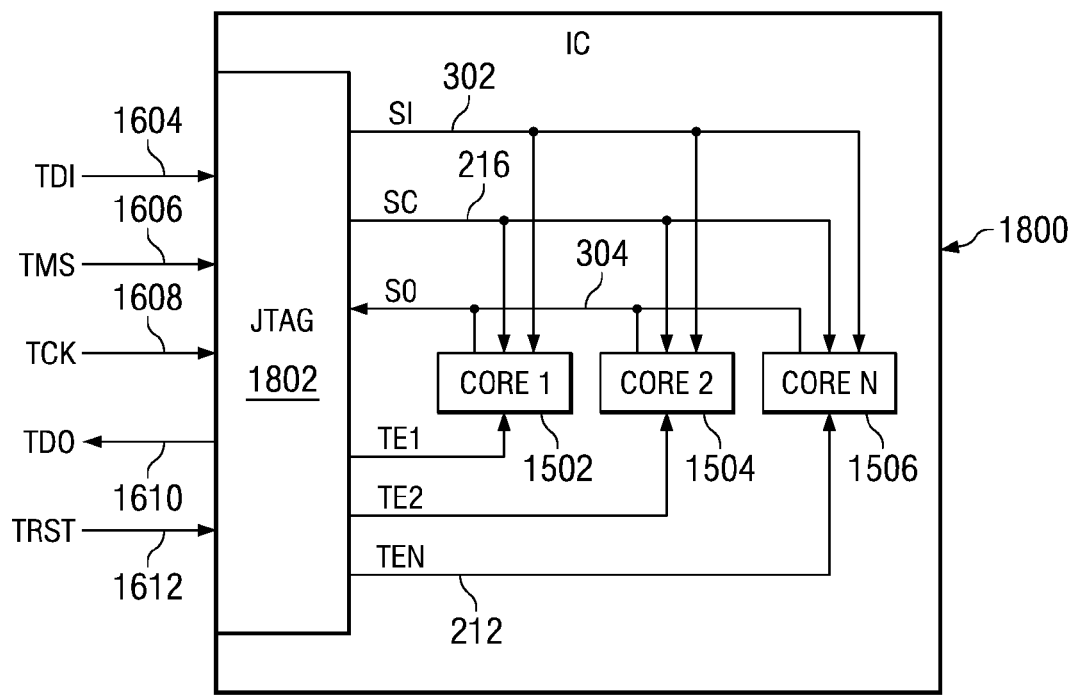
FIG. 18 illustrates multiple core test architectures interfaced to a tester via a JTAG interface.

FIG. 18 illustrates an integrated circuit 1800 with a JTAG circuit 1802 being used to access the cores 1-N 1502-1506 of FIG. 15 for testing. The JTAG circuit 1802 is the same as the JTAG circuit 1614 of FIG. 16 with the exception that the JTAG circuit 1802 has a separate TE (1-N) signal 212 for each core 1-N, which allows each core 1-N to be individually enabled and tested. In the integrated circuit of FIG. 15, testing N cores required the tester to provide N separate test enable inputs to the integrated circuit. In the integrated circuit of FIG. 18, the tester only needs to provide the JTAG interface signals to the integrated circuit since the test enable signals are internally provided by the JTAG circuit 1802.

Figure 19:
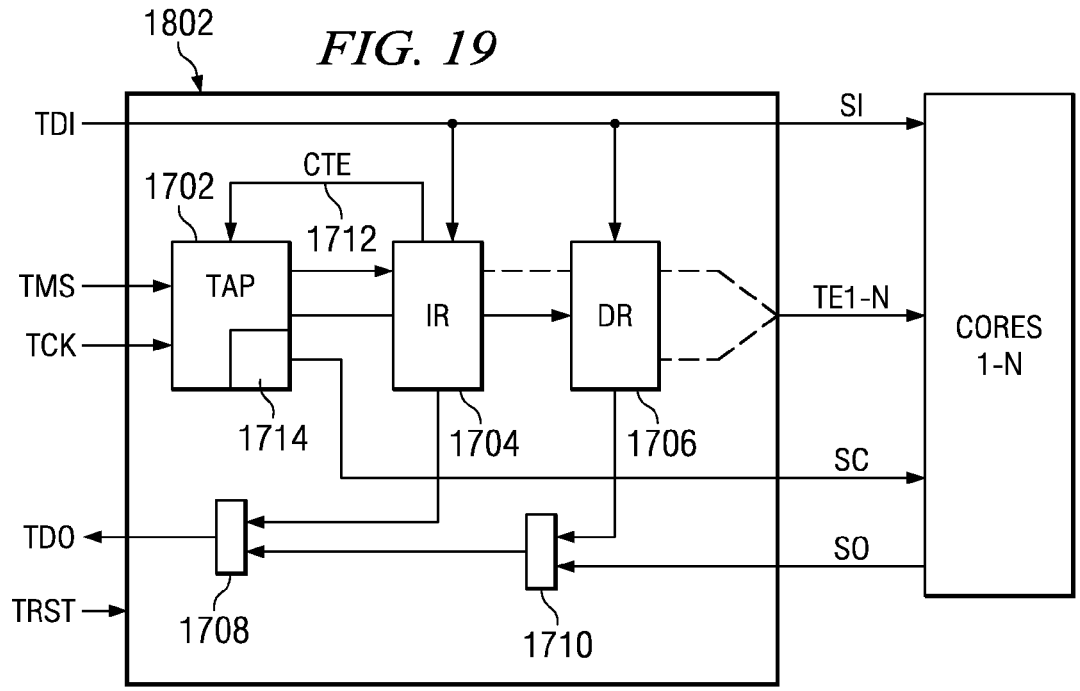
FIG. 19 illustrates a detail view of the JTAG interface of FIG. 18.

FIG. 19 illustrates the JTAG circuit 1802 in more detail. As with the single TE 212 of FIG. 17, the separate core TE's 212 of FIG. 19 may come from either the IR 1704 or a DR 1706 of the JTAG circuit 1802. Once a core has been enabled, by setting its TE input high, the core can be tested as described in FIG. 17 by either inputting and outputting continuous scan frames while the TAP controller is in the Shift-DR state or by inputting and outputting one scan frame at a time by cycling the TAP controller through its DR shifting and RunTest/Idle states. The cores not enabled will have their SO outputs tristated by buffer 1508 of FIG. 15 to allow only the enabled core to drive the SO 304 input to the JTAG circuit 1802.

Figure 20:
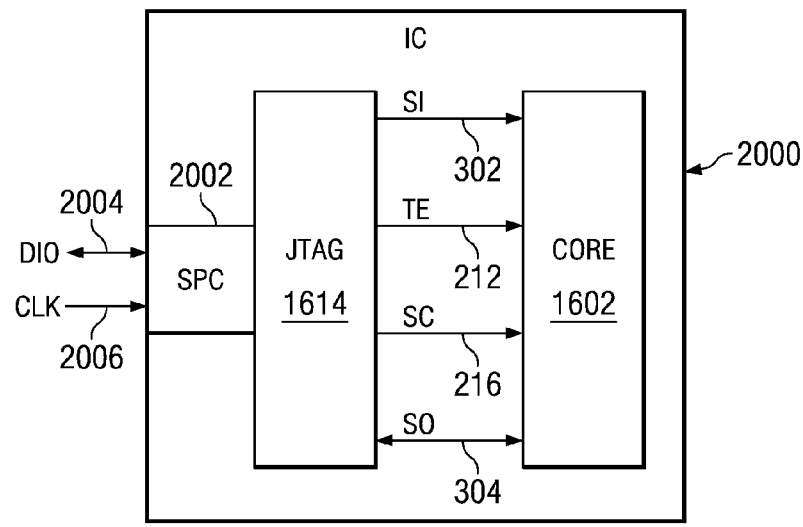
FIG. 20 illustrates a core's test architecture interfaced to a tester via a two signal JTAG interface circuit.

FIG. 20 illustrates an example of an integrated circuit 2000 having the JTAG circuit 1614 interfaced to a core 1602 as described previously in regard to FIG. 16. The TDI, TMS, TCK, TDO, and TRST interface signals of the JTAG circuit 1614 are interfaced to a serial to parallel controller (SPC) circuit 2002. The SPC 2002 has an external data input/output (DIO) signal 2004 and an external clock (CLK) signal 2006 which are connected to a tester. The SPC circuit 2002 allows the tester to communicate with the JTAG circuit 1602 using only the DIO and CLK signals.

Figure 21:
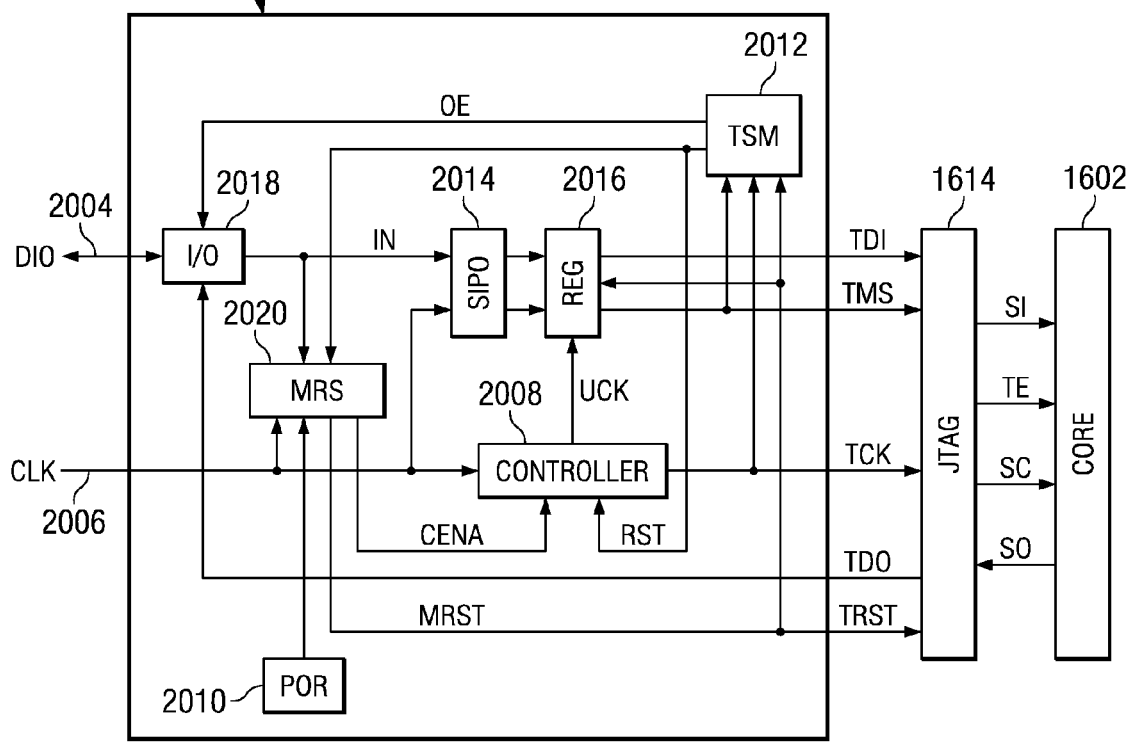
FIG. 21 illustrates a detail view of the two signal JTAG interface circuit of FIG. 20.

FIG. 21 illustrates in more detail the SPC circuit 2002 of FIG. 20. The structure and operation of SPC circuit 2002 is described in detail in regard to TI patent application TI-60187, which is incorporated herein by reference, so only a brief description of SPC circuit 2002 will be given. As described in the referenced patent TI-60187, the SPC circuit consists of a data input/output (I/O) circuit 2004, a master reset and synchronization (MRS) circuit 2006, a controller 2008, a power on reset (POR) circuit 2010, a TAP state machine (TSM) circuit 2012, a serial input parallel output (SIPO) circuit 2014, and a register 2016 all connected as shown. The I/O circuit 2004 is simply the SBT circuit described earlier in FIGS. 13 and 13A.

The MRS circuit 2006 is responsible for holding the SPC 2002 and connected JTAG circuit 1614 in a reset state when no tester is connected to the DIO and CLK signals and for synchronizing the operation of the SPC with the tester when they are first connected. The controller 2008 is driven by the CLK input and provides an update clock (UCK) to register 2016 and a TCK to the JTAG circuit 1614. The POR circuit 2010 is used for resetting the SPC when power is first applied to the integrated circuit 2000. TSM circuit is used to track the states of the TAP controller in the JTAG circuit 1614. The SIPO circuit 2014 converts serialized 2-bit data packets input on DIO 2004 into parallel TDI and TMS signals to register 2016. The register 2016 stores the parallel TDI and TMS signal outputs from the SIPO 2014 and inputs them to the JTAG circuit 1614.

During operation, the I/O circuit simultaneously inputs and outputs data on the DIO signal, as described previously in regard to the SBT of FIGS. 13 and 13A. The data input on DIO is shifted into the SIPO and output to the JTAG 1614 circuit's TDI and TMS inputs via the register 2016. The data output on DIO comes from the TDO output of the JTAG circuit 1614. The JTAG circuit 1614 is timed by the TCK output from controller 2008 to input the TDI and TMS signals from register 2016 and to output the TDO signal to I/O circuit 2004 during JTAG data and instruction scan operations. The JTAG circuit 1614 is reset by the master reset (MRST) output of MRS circuit 2004, which drives the TRST input of the JTAG circuit 1614. The SPC serves to serialize the JTAG communication between the tester and the JTAG circuit 1614 using the DIO 2004 and CLK 2006 signals. Using the two signal DIO and CLK interface of the SPC a tester would only need two contacts to each integrated circuit being tested in parallel.

Figure 22:
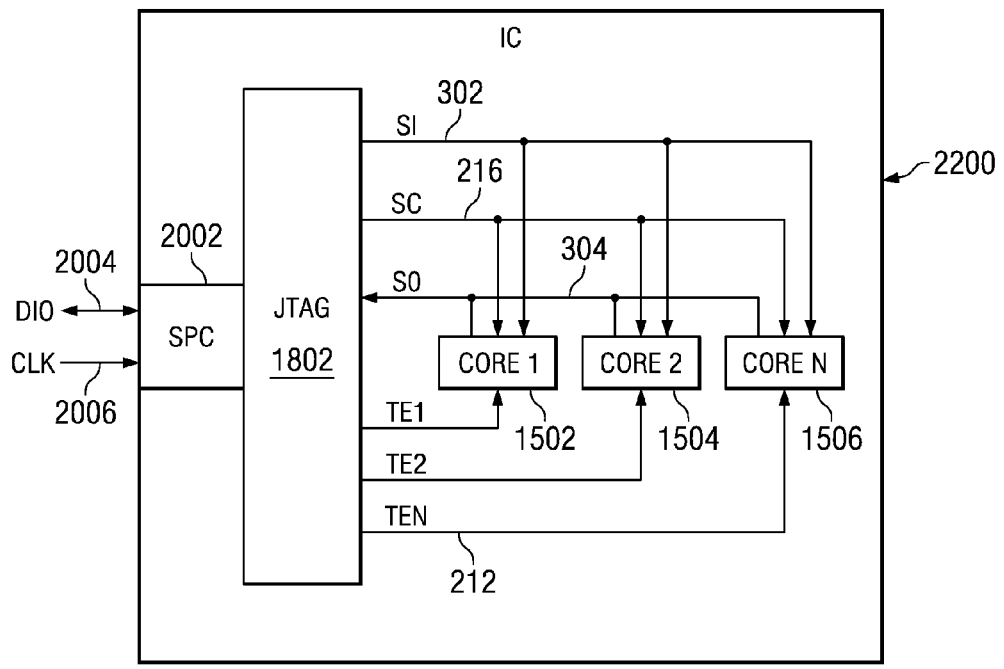
FIG. 22 illustrates multiple core test architectures interfaced to a tester via a two signal JTAG interface circuit.

FIG. 22 illustrates an example of an integrated circuit 2200 having the JTAG circuit 1802 interfaced to cores 1-N 1502-1506 as described previously in regard to FIG. 18. The TDI, TMS, TCK, TDO, and TRST interface signals of the JTAG circuit 1802 are interfaced to the SPC circuit 2002 as described in FIGS. 20 and 21. The SPC 2002 communicates with a tester via the external DIO and CLK signals as described in FIGS. 20 and 21.

Figure 23:
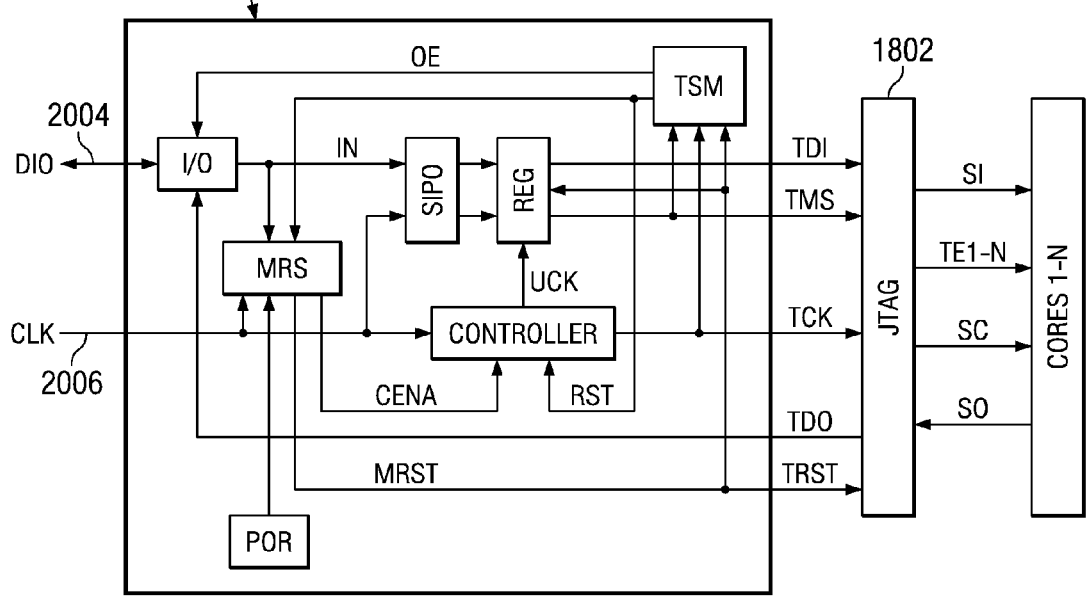
FIG. 23 illustrates a detail view of the two signal JTAG interface circuit of FIG. 22.

FIG. 23 illustrates in more detail the SPC circuit 2002, JTAG circuit 1802, and core circuits 1-N of FIG. 22. The structure and operation of the SPC circuit 2002 to serialize the JTAG communication between the JTAG circuit 1802 and the tester, via the DIO and CLK signals, is the same as described in FIG. 21. The structure and operation of the JTAG circuit 1802 to enable the cores for testing via the TE 1-N signals is the same as described in FIG. 18. FIGS. 22 and 23 are provided to illustrate that multiple cores 1502-1506 within an integrated circuit 2200 can enabled and tested as described in FIG. 18 using the SPC's DIO 2004 and CLK 2006 interface to a tester.

Figure 24:
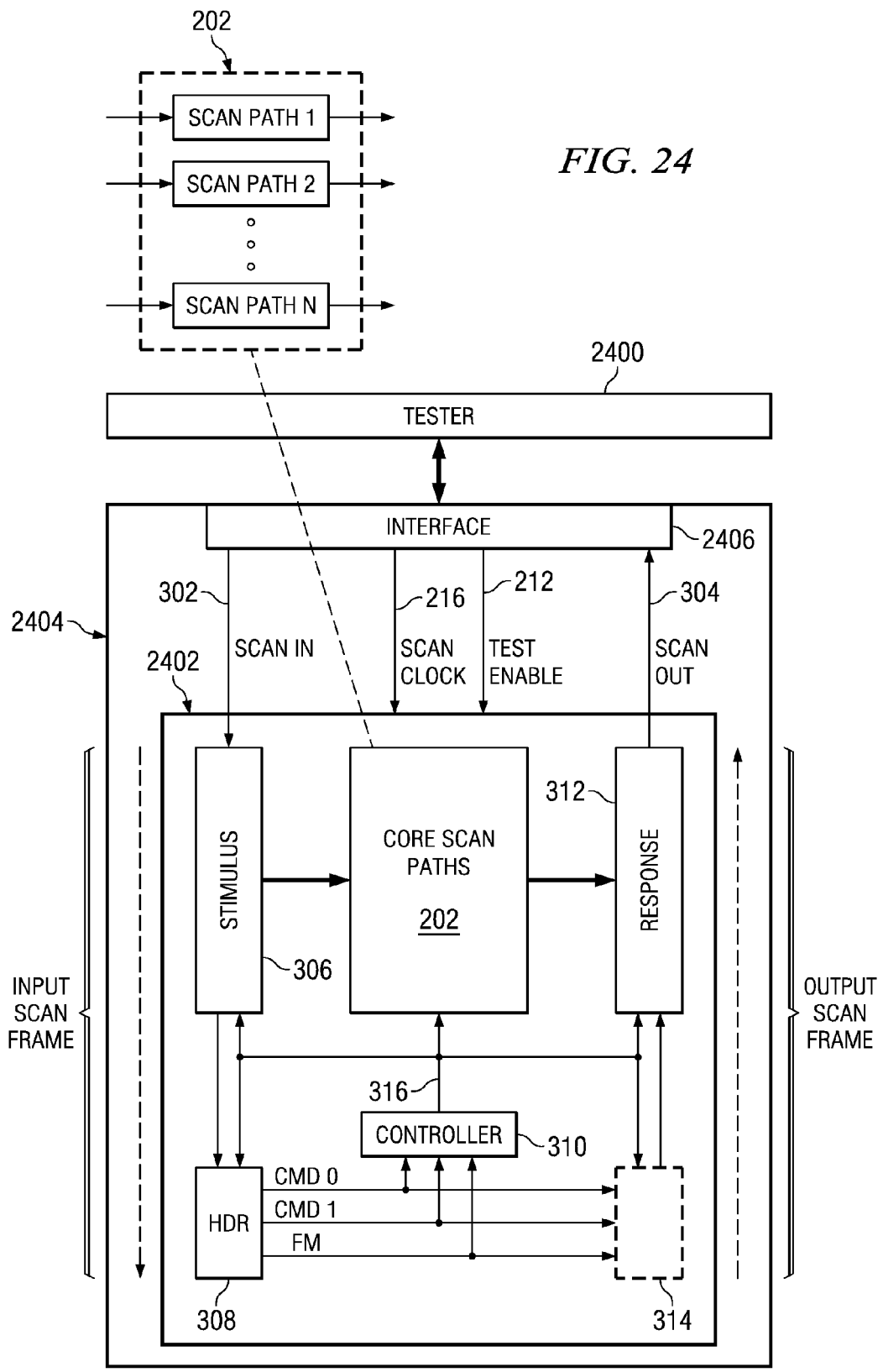
FIG. 24 illustrates the test architecture of the present disclosure interfaced to a tester via various types of interfaces.

FIG. 24 illustrates a tester 2400 coupled to the scan input 303, scan clock 216, test enable 212, and scan out 304 signals of the test architecture of a core 2402 of an integrated circuit 2404 via an interface 2406. The interface 2406 may represent; (1) the interface of the signals to the tester as shown in FIG. 3 (i.e. unidirectional interface), (2) the interface of the signals to the tester as shown in FIG. 12 (i.e. differential interface), the interface of the signals to the tester as shown in FIG. 13 (i.e. SBT interface), the interface of the signals to the tester as shown in FIGS. 16-19 (i.e. JTAG interface), or the interface of the signals to the tester as shown in FIG. 20-23 (i.e. SPC interface). In addition to these mentioned interfaces, interface 2406 may represent other types of interfaces that may be used to couple the scan input, scan clock, test enable, and scan output signals of the test architecture to the tester.

Figure 25:
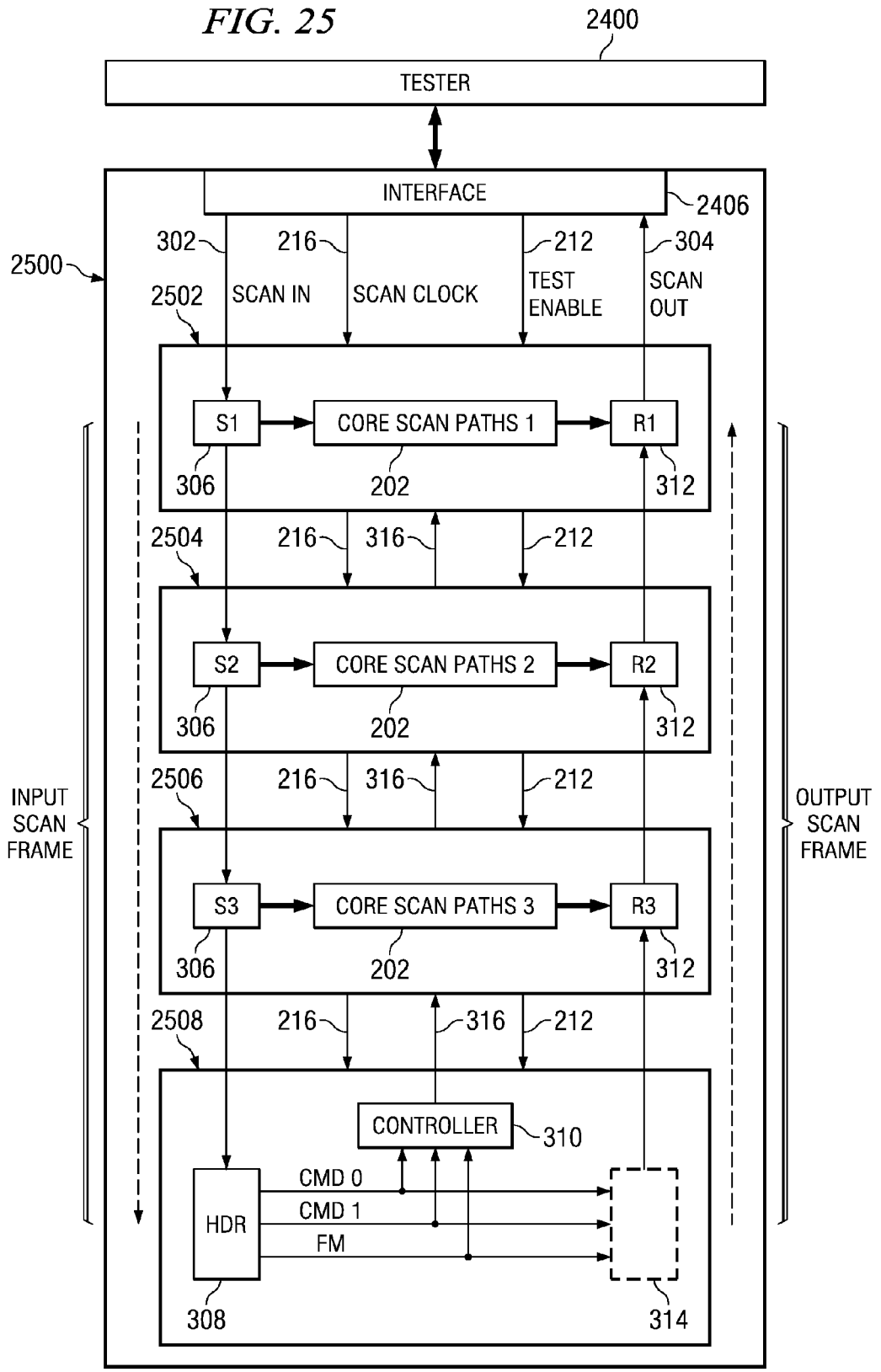
FIG. 25 illustrates an integrated circuit whereby multiple cores are tested simultaneously according to the present disclosure.

FIG. 25 illustrates an alternate arrangement for using the test architecture within an integrated circuit 2500 that includes multiple embedded cores 2502-2506. The alternate arrangement configures the cores to where their stimulus (S) sections 306 and response (R) sections 312 are serialized to form a single scan path of stimulus sections and a single scan path of response sections 312. The header section 308, controller 310, and optional header return section 314 are shown as circuit block 2508. The serial input to header section 308 is coupled to the serial output of the stimulus section 306 of the last core 2506 in the series of cores and the serial output of the optional header return section 314 is coupled to the serial input of the response section 312 of the last core 2506 in the serial of cores. While not shown in FIG. 25, the control bus output 316 of controller 310 is coupled to the header sections 308, optional header return section 314, and to the scan paths 202, stimulus sections 306, and response sections 312 of each core 2502-2506 as shown in FIG. 24 and other Figures. The scan clock 216 and test enable 212 signals from the tester are input to the controller 310 as shown in FIG. 4.

During test, the controller 310 receives and responds to the scan clock 216 and test enable input 212 to output control on control bus 316 to operate the core scan paths 202, core stimulus sections 306, core response sections 312, the header section 308, and the optional header return section 314 as previously described in FIGS. 6-11. To the tester 2410, the series of core stimulus sections 306 appear as one long stimulus section and the series of core response sections 312 appear as one long response section. The tester 2410 transmits scan input frames to the series of core stimulus sections 306 and header section 308 via the scan input 302 and receives scan output frames from the series of core response sections 312 and optional header return section 314 via the scan output 304. The core test arrangement of FIG. 25 differs from the core test arrangement in FIG. 15 in that; (1) all cores 2502-2506 are enabled for testing by a single test enable 212 input from the tester, and (2) all cores 2502-2506 are tested at the same time by the tester inputting scan input frames on scan input 302 and outputting scan output frames on scan output 304.

As previously mentioned in FIG. 24, the interface 2406 of FIG. 25 may represent; (1) the interface of the signals to the tester as shown in FIG. 3 (i.e. unidirectional interface), (2) the interface of the signals to the tester as shown in FIG. 12 (i.e. differential interface), the interface of the signals to the tester as shown in FIG. 13 (i.e. SBT interface), the interface of the signals to the tester as shown in FIGS. 16-19 (i.e. JTAG interface), the interface of the signals to the tester as shown in FIG. 20-23 (i.e. SPC interface), or other types of interfaces that may be used to couple the scan input 302, scan clock 216, test enable 212, and scan output 304 signals of the test architecture to the tester 2410.

Figure 26:
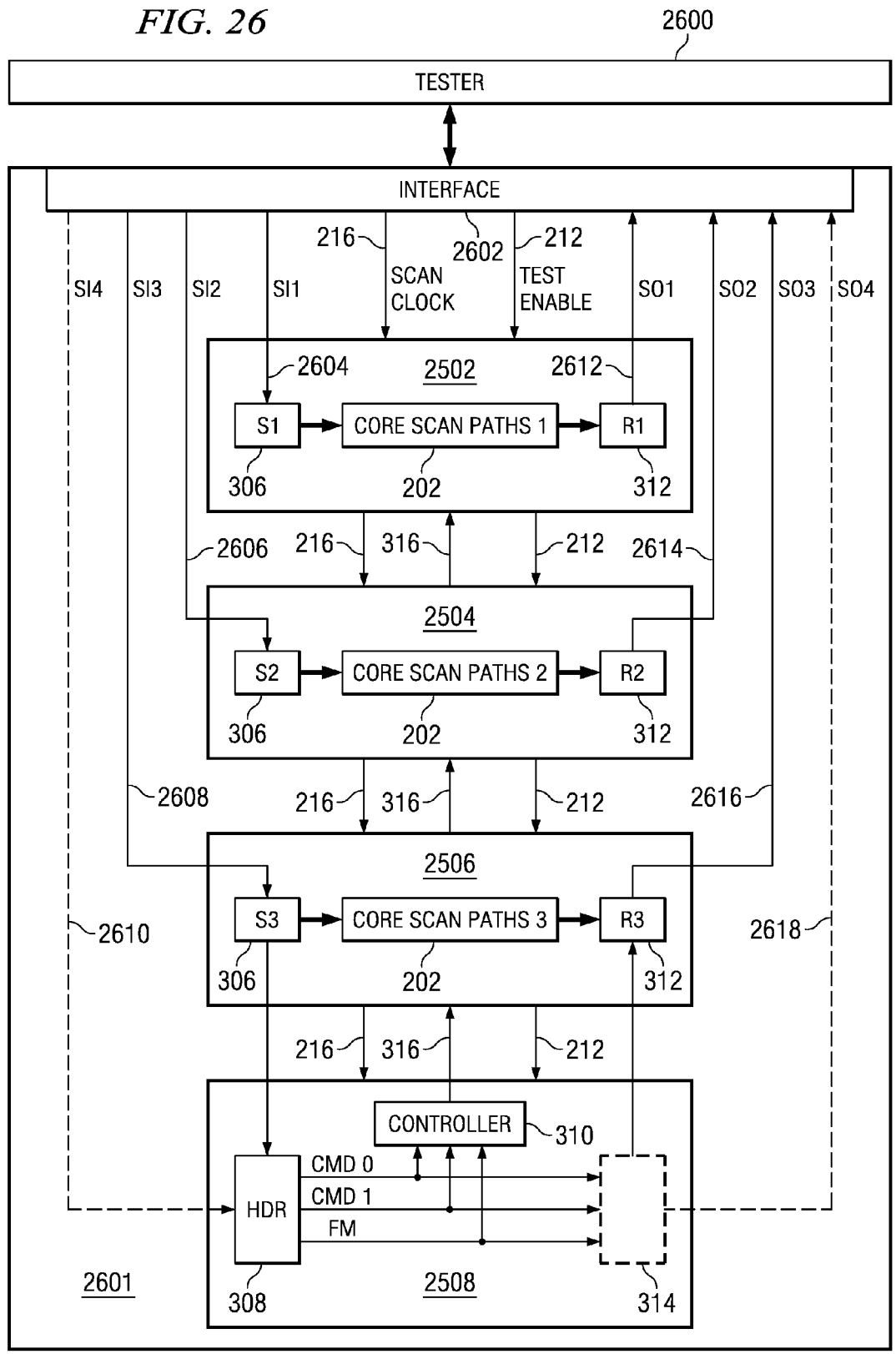
FIG. 26 illustrates multiple cores within an integrated circuit, each containing the test architecture of the present disclosure whereby each test architecture is interfaced to a tester via a separate scan input and a separate scan output.

FIG. 26 is provided to illustrate that the interface of the integrated circuit test architecture of FIG. 25 may be modified to include more that one scan input (SI) from a tester and more than one scan output (SO) to a tester. As seen, the serial input to each stimulus input section 306 of each core is coupled, via interface 2602, to the tester 2600 via a SI 2604-2608 and the serial output from each response section 312 is coupled, via interface 2602, to the tester 2600 via a SO 2612-2616. Having separate SIs allows the tester to load scan input frames into the core stimulus sections 306 in parallel. Having separate SOs allows the tester to unload scan output frames from the core response sections 312 in parallel. The ability to load the stimulus sections 306 and unload the response sections 312 in parallel decreases the time it takes for the tester to input scan frames to and output scan frames from the test architecture, which decreases the time it takes to test the integrated circuit 2601.

For example if each stimulus section 306 and each response section 312 of FIG. 25 were 16 bits in length, each scan input and output frame operation would require 51 bits, i.e. 3×16 bits plus the 3 header section bits. Using the same 16 bit stimulus 306 and response 312 sections and the separate SIs and SOs of FIG. 26, scan input and output frame operations would only required 19 bits, i.e. 16 bits plus the 3 header bits. As seen, the header section 308 and optional header return section 314 may use a separate scan input 2610 and scan output 2618 respectively if desired, which would further reduce the scan input and output frame operations to only 16 bits. The only changes to the tester 2600 and the interface circuit 2602 is an increase the number of scan inputs and scan outputs to the integrated circuit 2601.

The interface 2602 of FIG. 26 between the tester 2600 and the test architecture may utilize unidirectional input and output signals as shown in FIG. 3, differential input and output signals as shown in FIG. 12, or other types of signaling interfaces to couple the test architecture's scan inputs 2604-2608, scan clock 216, test enable 212, and scan outputs 2612-2616 to the tester 2600.

Figure 27:
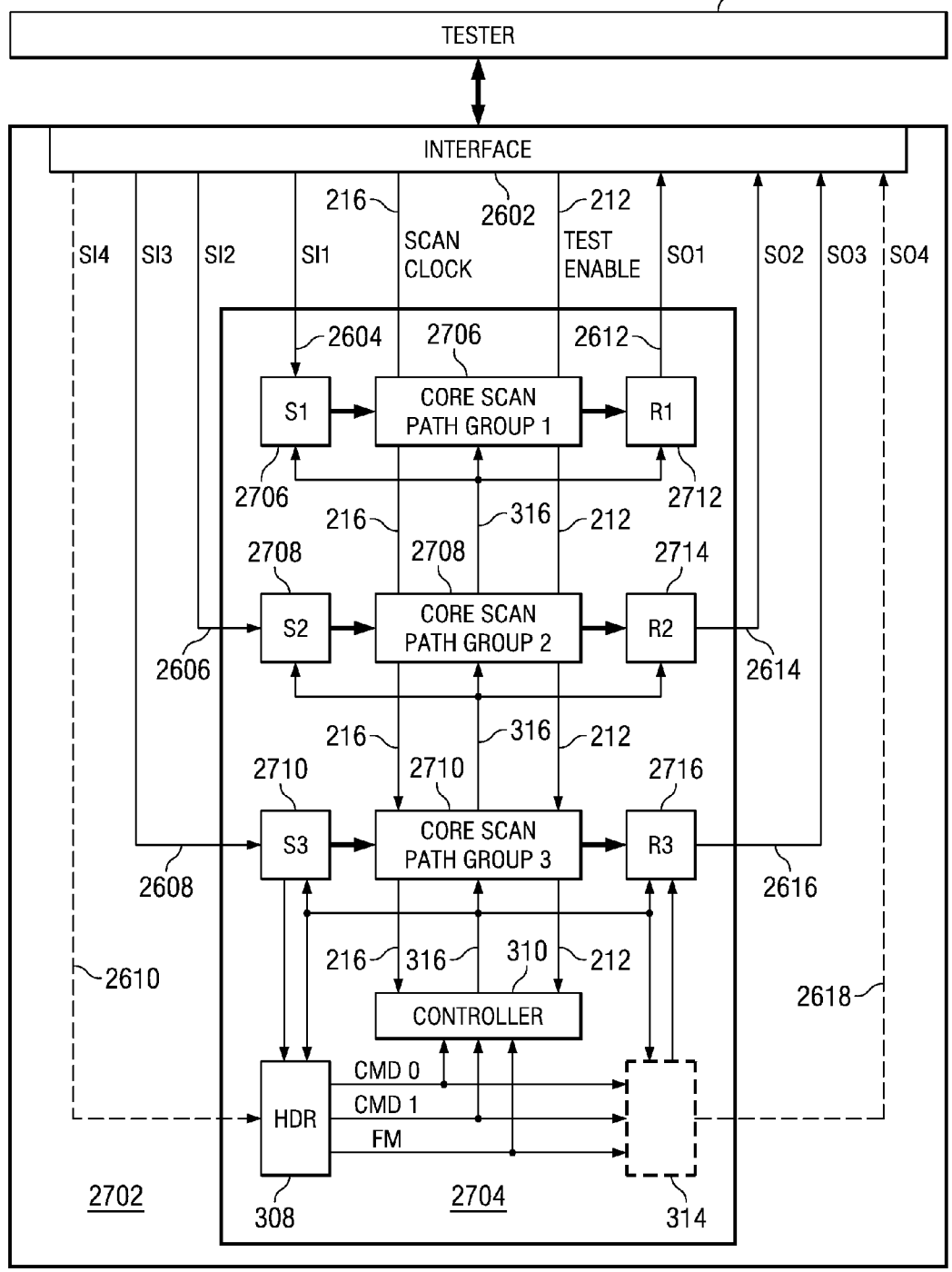
FIG. 27 illustrates a single core within an integrated circuit containing the test architecture of the present disclosure whereby the core test architecture is interfaced to a tester via multiple scan inputs and multiple scan output.

FIG. 27 is provided to illustrate that the test architecture of an individual core 2704 within an integrated circuit 2702 may be modified to include more that one scan input (SI) from a tester 2600 and more than one scan output (SO) to a tester 2600. In FIG. 27 the core scan paths 202 have been broken up into core scan path groups 2706-2710, with each group containing a portion of the total number of core scan paths 202. Each scan path group has a separate stimulus section 2706-2710 and a separate response section 2712-2716. The serial input to each stimulus section 2706-2710 is coupled, via interface 2602, to the tester 2600 via a separate scan input signal 2604-2608, and each serial output from each response section 2712-2716 is coupled, via interface 2602, to the tester 2600 via a separate scan output signal 2612-2616 signal.

As described by example in regard to FIG. 26, having separate scan inputs to the stimulus sections and separate scan outputs from the response sections allows the tester to more quickly load scan input frames to the test architecture and unload scan output frames from the test architecture, which reduces test time. As mentioned in FIG. 26, the header section 308 and optional header return section 314 may use a separate scan input 2610 and scan output 2618 respectively if desired, which would further reduce the time it takes to perform scan input and output frame operations. Also as mentioned in FIG. 26, the interface 2602 between the tester 2600 and the test architecture may utilize unidirectional input and output signals as shown in FIG. 3, differential input and output signals as shown in FIG. 12, or other types of signaling interfaces to couple the test architecture's scan inputs 2604-2608, scan clock 216, test enable 212, and scan outputs 2612-2616 to the tester 2600.

While the FM signal of FIGS. 24-27 are shown coming from the header section 308, it could come from another circuit within the integrated circuit as mentioned in regard to FIG. 14A or from the tester via an additional external signal as mentioned in regard to FIG. 14B.

Although exemplary embodiments of the present disclosure have been illustrated and described above, this does not limit the scope of the present disclosure, which can be practiced in a variety of embodiments.

What is claimed is:

1. Controller circuitry comprising:
   A. state machine circuitry having a command 0 input, a command 1 input, a frame marker input, a scan clock input, a test enable input, a clock 2 enable output, a parallel scan enable output, and a serial scan enable output, in response to signals on the command 0 input, the command 1 input, and the frame marker input, and clock signal cycles on the scan clock input, the state machine circuitry having:
      i. a first state producing an enable signal on the clock 2 enable output of one clock signal cycle;
      ii. a second state producing enable signals on the clock 2 enable output of two clock signal cycles; and
      iii. a third state producing enable signals on the clock 2 enable output of three clock signal cycles;
   B. first gate circuitry having a first input connected to clock 2 enable output, a second input connected to the scan clock input, and a clock 2 output; and
   C. second gate circuitry having a first input connected to the scan clock input, a second input connected to the test enable input, and a clock 1 output.

2. The controller circuitry of claim 1 including a command lead connected to the command input and a command output of a flip-flop.

3. The controller circuitry of claim 1 including a frame marker lead connected to the frame marker input and a frame marker output of a flip-flop.

4. The controller circuitry of claim 1 in which the controller circuitry is included in an integrated circuit and a scan clock lead extends from the scan clock input onto the integrated circuit.

5. The controller circuitry of claim 1 in which the controller circuitry is included in an integrated circuit and a test enable lead extends from the test enable input onto the integrated circuit.

6. The controller of claim 1 including scan circuitry and a clock 1 lead connected from the clock 1 output to the scan circuitry.

7. The controller of claim 1 including scan circuitry and a clock 2 lead connected from the clock 2 output to the scan circuitry.

8. The controller of claim 1 including scan circuitry and a parallel scan enable lead connected from the parallel scan enable output to the scan circuitry.

9. The controller of claim 1 including scan circuitry and a serial scan enable lead connected from the serial scan enable output to the scan circuitry.

* * * * *